United States Patent [19]
Munks et al.

[11] Patent Number: 6,134,253
[45] Date of Patent: Oct. 17, 2000

[54] METHOD AND APPARATUS FOR MONITORING AND CONTROL OF LASER EMISSION WAVELENGTH

[75] Inventors: Timothy C. Munks, Crystal Lake, Ill.; Paul E. Dunn, Westfield, Mass.; David J. Allie, Storrs, Conn.

[73] Assignee: JDS Uniphase Corporation, San Jose, Calif.

[21] Appl. No.: 09/025,987

[22] Filed: Feb. 19, 1998

[51] Int. Cl.[7] .................................................. H01S 3/00
[52] U.S. Cl. ............................ 372/38; 372/9; 372/23; 372/25; 372/29; 372/32; 372/33
[58] Field of Search .................................... 372/9, 23, 24, 372/29, 32, 33, 38, 34, 25

[56] References Cited

U.S. PATENT DOCUMENTS

| | | | |
|---|---|---|---|
| 4,737,798 | 4/1988 | Lonis et al. | 372/29 X |
| 4,815,081 | 3/1989 | Mahlein et al. | 372/32 |
| 4,821,273 | 4/1989 | Hori | 372/34 X |
| 4,913,525 | 4/1990 | Asakura et al. | 350/162.12 |
| 4,955,029 | 9/1990 | Lecoy et al. | 372/38 X |
| 5,042,042 | 8/1991 | Hori et al. | 372/32 X |
| 5,068,864 | 11/1991 | Javan | 372/32 |
| 5,208,819 | 5/1993 | Huber | 372/34 |
| 5,287,367 | 2/1994 | Yanagawa | 372/31 |
| 5,299,212 | 3/1994 | Koch et al. | 372/32 |
| 5,313,480 | 5/1994 | Fidric et al. | 372/32 |
| 5,323,409 | 6/1994 | Laskoskie et al. | 372/32 |
| 5,428,700 | 6/1995 | Hall | 372/32 |
| 5,544,183 | 8/1996 | Takeda | 372/32 |
| 5,577,059 | 11/1996 | Lee et al. | 372/22 |
| 5,691,989 | 11/1997 | Rakuljic et al. | 372/20 |
| 5,706,301 | 1/1998 | Lagerstrom | 372/32 |
| 5,780,843 | 7/1998 | Cliche et al. | 250/226 |
| 5,781,572 | 7/1998 | Tahara et al. | 372/34 |
| 5,798,859 | 8/1998 | Colbourne et al. | 359/247 |
| 5,825,792 | 10/1998 | Villeneuve et al. | 372/32 |
| 5,867,513 | 2/1999 | Sato | 372/32 |
| 5,915,052 | 6/1999 | Ball | 385/24 |

FOREIGN PATENT DOCUMENTS

| | | | |
|---|---|---|---|
| 0 516 318 A2 | 5/1992 | European Pat. Off. | 372/32 X |
| 0 516 318 A3 | 5/1992 | European Pat. Off. | 372/32 X |
| 0 818 859 A1 | 1/1998 | European Pat. Off. | 372/32 X |
| JP 58171880 | 10/1983 | Japan | 372/32 X |
| JP 07007212 | 1/1995 | Japan | 372/32 |
| JP 04157780 | 2/1997 | Japan | 372/32 X |
| JP 09219554 | 8/1997 | Japan | 372/32 X |
| WO 97/05679 | 2/1997 | WIPO | 372/32 X |
| WO 97/07577 | 2/1997 | WIPO | 372/32 X |
| WO 98/50988 | 11/1998 | WIPO | 372/32 X |

OTHER PUBLICATIONS

"Properties of Loss–Coupled Distributed Feedback Laser Arrays for Wavelength Division Multiplexing Systems", by Stefan Hansmann, et al., *Journal of Lightwave Technology* vol. 15, No. 7 (Jul. 1997).

(List continued on next page.)

*Primary Examiner*—Brian Healy
*Attorney, Agent, or Firm*—McCormick, Paulding & Huber LLP

[57] ABSTRACT

An apparatus for monitoring and controlling the wavelength of laser radiation includes at a least one optical filter for receiving laser radiation and for transmitting and reflecting first and second filtered beams, respectively. The beams are filtered according to respective first and second spectral filter functions that cross at least one crossing wavelength. A beam comparing element compares the intensities of the first and second filtered beams and produces an error signal responsive to the deviation of the wavelength of the laser radiation from a set point wavelength. The beam comparing element can include first and second optical detectors and an error circuit for producing the error signal by taking a ratio or the difference of the signals detected by the detectors. Varying the angle of incidence of the laser radiation upon at least one optical filter varies the spectral filter function of that for selecting or varying the operating wavelength of the laser. A laser wavelength controller can receive the error signal for stabilizing or tuning the wavelength of the laser radiation. Several addition embodiments of the invention are disclosed.

40 Claims, 17 Drawing Sheets

OTHER PUBLICATIONS

"Single–Angled–Facet Laser Diode for Widely Tunable External Cavity Semiconductor Lasers with High Spectral Purity", by P.J.S. Heim, et al., *Electronics Letters*, vol. 33, No. 16 (Jul. 31, 1997).

"Monolithic Mode–Locked Semiconductor Laser for Continuously Tunable Millimeter–Wave Transmission", by Dennis T.K. Tong, et al., *SPIE*, vol. 3038.

"2.5 Gbit/s Directly–Modulated Fibre Grating Laser for WDM Networks", by F.N. Timofeev, et al., *Electronics Letters*, vol. 33, No. 16 (Jul. 31 1997).

"2.5 Gbit/s Directly–Modulated Fibre Grating Laser for Optical Networks", by F.N. Timofeev, et al., *The Institute of Electrical Engineers*, 1997.

"Visible Laser Sources Based on Frequency Doubling in Nonlinear Waveguides", by Jonas Webjorn, et al., *IEEE*, 1997.

"Experimental Demostration of an All–Optical Routing Node for Multihop Wavelength Routing Networks", by M. Shell, et al., *IEEE*, 1996.

"Continuously Chirped DFB Gratings by Specially Bent Waveguides for Tunable Lasers", by Hartmut Hillmer, et al., *Journal of Lightwave Technology*, vol. 13, No. 9 (Sep. 1995).

"Sprectral Dynamics of Widely Tunable Four–Section Sampled Grating DBR Lasers", by Gardiner, et al., Conference Proceedings –Lasers and Electro–Optics Society Annual Meeting Proceedings of the 1996 Conference on Lasers and Electro–Optics, ELEO'96 (Jun. 2–7, 1996).

"Optical Frequency Switching with SSG–DBR Structured Devices", by Hiroshi Yasaka, et al., *NTT Opto–Electronics Laboratories*(1995).

"Wavelength Tuning in Three Section Sampled Grating DBR Lasers", C.K. Gardiner, et al., *Electronics Letters*, vol. 31, No. 15 (Jul. 20, 1995).

"A2.5–Gbit/s Return–to–Zero Integrated DBR Laser/Modulator Transmitter", by G. Raybon, et al., *IEEE Photonics Technology Letters*, vol. 6, No. 11 (Nov. 1994).

"Tunable Lasers for Photonic Integrated Circuits", by L.A. Coldren, et al., *CLEOS Summer Topical Meeting Integrated Optoeelectronics Proceedings of the CLEOS 1994 Summer Topical Meeting*(Jul. 6–8, 1994).

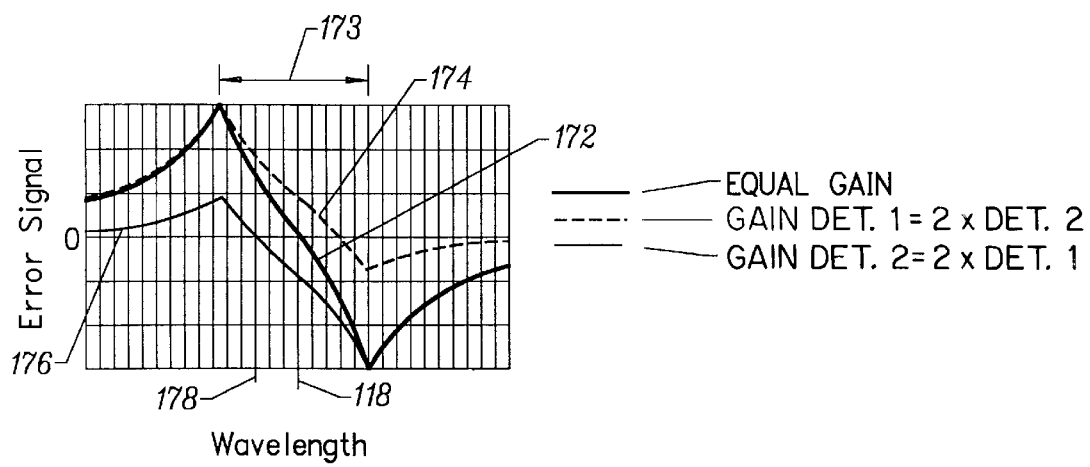
FIG. 6
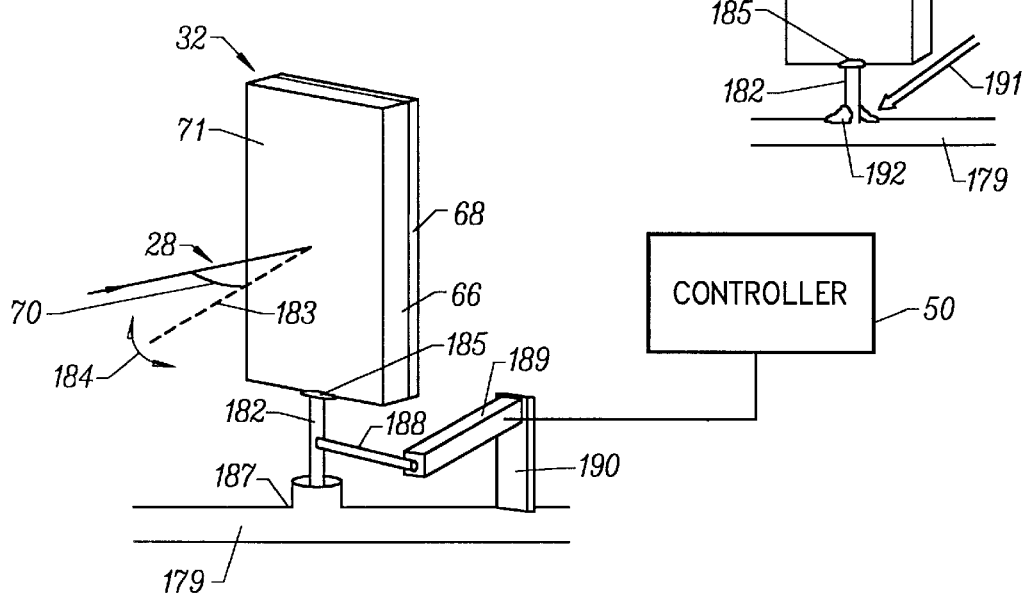
FIG. 7B
FIG. 7A

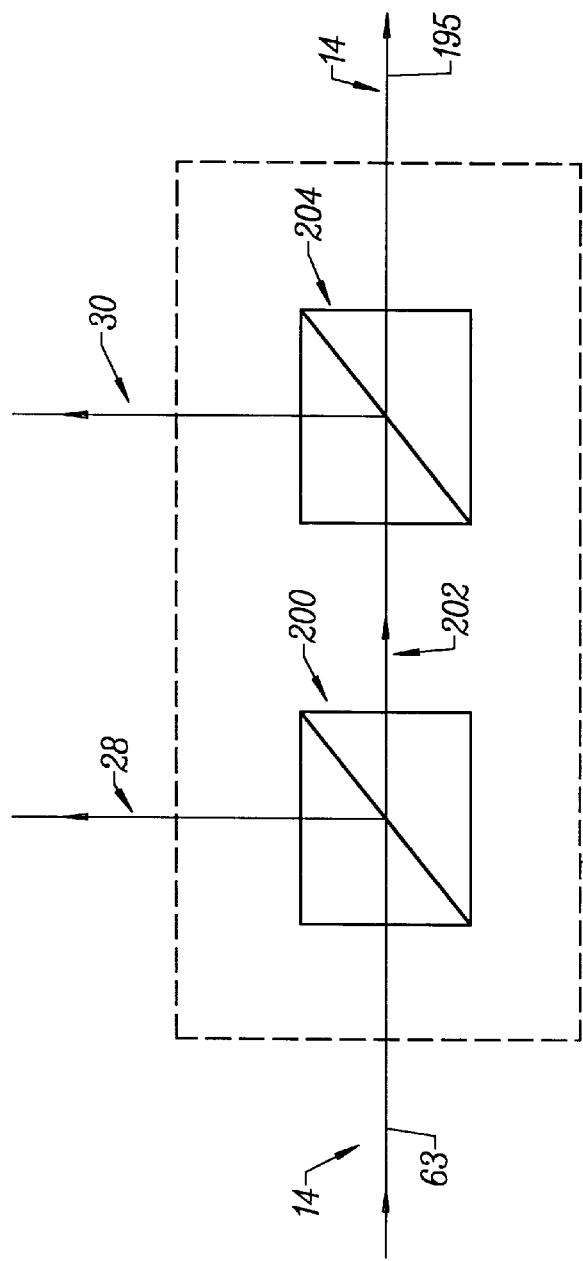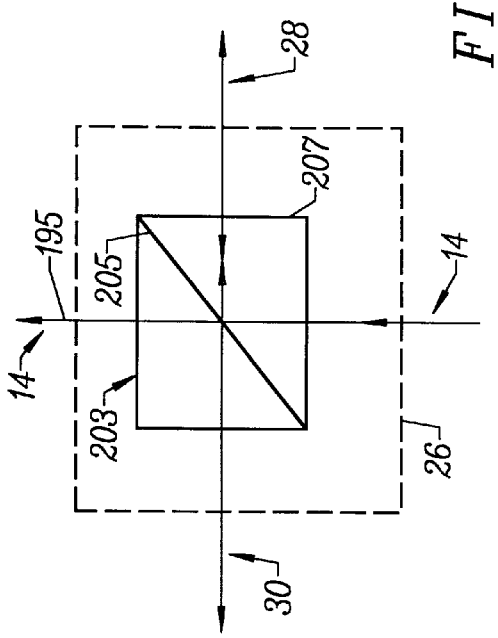

METHOD AND APPARATUS FOR MONITORING AND CONTROL OF LASER EMISSION WAVELENGTH

FIELD OF THE INVENTION

This invention relates to lasers and more particularly to apparatus for monitoring, controlling, and stabilizing the wavelength of the laser radiation.

CROSS REFERENCE TO RELATED APPLICATIONS

Some of the matter contained herein is disclosed and claimed in the following commonly owned U.S. patent applications: U.S. patent application Ser. No. 08/934,189, pending, entitled "Integrated Wavelength-Select Transmitter"; U.S. patent application Ser. No. 08/885,428, pending, entitled "Process For Fabrication And Independent Tuning Of Multiple Integrated Optical Directional Couplers On A Single Substrate"; U.S. patent application Ser. No. 08/885,449, now abandoned, entitled "Method and Apparatus For Dynamically Equalizing Gain In An Optical Network"; U.S. patent application Ser. No. 08/885,427, now U.S. Pat. No. 5,915,052, entitled "Loop Status Monitor For Determining The Amplitude Of Component Signals Of A Multi-Wavelength Optical Beam"; and U.S. Pat. application Ser. No. 08/884,747, pending, entitled "Dynamic Optical Amplifier," all of which are herein incorporated by reference.

BACKGROUND

Dense Wavelength Division Multiplexing (DWDM) involves transmitting large volumes of information, such as voice, video, or data signals, over an optical beam path by transmitting the information over several discrete optical channels, each operating at a selected wavelength. Each channel employs a laser light source, typically a distributed-feedback (DFB) laser, that produces a beam at the selected wavelength. A modulator modulates the beam to carry the channel's data. The beams for the individual channels are combined to travel the optical beam path, typically over a path including optical fiber, such as a polarization-maintaining fiber. However the optical beam path can also include free space. Each channel is appropriately demodulated at a receiving end of the optical beam path.

One important concern with DWDM systems is achieving higher data rates, such as by increasing the number of channels. One factor limiting the number of channels is the wavelength stability of the laser sources. The wavelength of a laser light source typically drifts over time, due to the above factors, and the channels cannot be so closely spaced such that the wavelength of one channel laser source drifts to the wavelength at which another channel light source is operating. Information will be lost. Accordingly, the better the stabilization of the wavelength of the laser sources, the more densely the channels can be packed on a wavelength.

The wavelength of a DFB laser is known to be affected by several factors, such as laser source current, temperature, and aging. In most practical applications, the temperature of the laser is regulated to stabilize the wavelength, as changing the current affects the overall system power budget and has limited range. DFB lasers are typically temperature stabilized using a thermal-control loop consisting of a thermistor to sense the device temperature, an electronic feedback loop, and a thermoelectric cooler (TEC). Thermal regulation is employed because it also protects the DFB laser from overheating, and helps to stabilize power output of the laser. However, such known techniques require improvement to realize more channels, and hence higher data rates, in a DWDM system.

Another important concern in implementing a DWDM system is wavelength management and optimization. System designers face difficult problems when optimizing a DWDM link. They need to minimize losses, yet maintain adequate channel isolation and consider other parameters relating to wavelength. The performance of several components within a DWDM link are sensitive to wavelength, such as optical amplifiers, multiplexers, demultiplexers, optical isolators, add drop multiplexers and couplers. Fiber dispersion is also a consideration. The ability to control, i.e., tune, the wavelength within an available channel is limited, and not typically fully realized as an optimization tool.

Yet another concern in operating such systems involves monitoring the laser radiation used for some, or all, of the channels. As noted above, the wavelength is known to vary with the electrical current supplied to the laser, the temperature of the laser, and with the aging of the laser. Monitoring of the wavelengths can be useful in maximizing performance of the overall information transmission system.

The problems of wavelength regulation, control, and monitoring have not been satisfactorily resolved. Better wavelength monitoring, regulation and control will allow higher performance laser information systems that are more readily designed, maintained and modified, and that are more densely packed channels, and hence higher data rates. Fewer types of lasers could achieve a given number of communication channels. Existing methods, such as the thermal control discussed above, are not entirely adequate.

Accordingly, it is one object of the invention to improve the information carrying capacity of laser systems.

It is another object of the invention to provide improved control and/or monitoring of the wavelength of radiation emanated by a laser.

It is yet another object of the invention to provide apparatus for wavelength monitoring and control which can be more readily integrated into typical laser systems.

An additional object of the invention is to provide a tunable and stabilized laser source of laser radiation for providing more versatile laser systems for the transmission of information.

Other objects of the invention will in part be apparent and in part appear hereinafter.

SUMMARY OF THE INVENTION

The present invention achieves these and other objects by providing an apparatus for monitoring the wavelength of laser radiation to produce an error signal responsive to the deviation of the wavelength from a set-point wavelength. The error signal can be used as part of a feedback loop to stabilize or otherwise control the wavelength of the laser, for example, by controlling the temperature of the laser or the current supplied to the laser. Modifying the manner in which the error signal is produced biases, or varies, the set-point wavelength, hence tuning the wavelength of the laser.

In one aspect, the invention provides an apparatus for monitoring the wavelength of laser radiation, including an optical beam splitting apparatus for splitting first and second split beams from a monitored beam having a monitored wavelength. A first optical filter is responsive to the first split beam for producing therefrom a first filtered beam in accordance with a first spectral filter function; a second optical filter is included for producing, responsive to the second split beam, a second filtered beam in accordance with a second spectral filter function.

The first filter includes a substrate having a filter layer thereon, and the filter layer includes at least one film layer having a dielectric constant differing form that of the substrate. A surface of one of the substrate and the filter layer is disposed for receiving the first split beam at a nonzero angle of incidence, and the nonzero angle is selected such that the first and second spectral filter functions cross at a selected crossing wavelength. The beam comparing element for compares the intensities of the first and second filtered beams for producing an error signal responsive to the deviation of the wavelength of the monitored beam from a wavelength set point, which can correspond to the crossing wavelength.

In another aspect, the invention provides a wavelength-stabilized laser system that includes a laser for producing a beam of laser radiation having a selected wavelength, and an element for splitting first and second laser light beams from the beam of laser radiation. A first optical filter is disposed for receiving at least a portion of the first split beam. The first filter produces a first filtered beam, and a photodetector is arranged for receiving at least a portion of the first filtered beam and for producing a first detected signal. A second optical filter is disposed for receiving at least a portion of the second split beam and for producing a second filtered beam, and a second photodetector receives at least a portion of the second split beam and produces a second detected signal. The first filter includes a substrate having a filter layer, the filter layer including at least one film layer having a dielectric constant differing from that of the substrate. An error signal circuit is in electrical communication with the first and second photodetectors for generating an error signal responsive to the first and second detected signals and to the deviation of the wavelength of the laser radiation from a set point wavelength. A laser wavelength control element is in electrical communication with the error circuit for adjusting the operating temperature of the laser in response to the error signal such that the wavelength of the laser tends toward the set point wavelength. The first split beam is incident on a surface of one of the substrate and the filter layer at a selected nonzero angle of incidence, and the angle is selected such that the first and second spectral filter functions define a wavelength capture range including the set point wavelength.

According to yet another feature of the invention, an apparatus for monitoring the wavelength of a monitored beam of laser radiation includes at least one optical filter. The optical filter includes a substrate having a filter layer, and the filter layer includes at least one film layer having a dielectric constant differing from that of the substrate. The optical filter receives at least a portion of the monitored beam at a selected nonzero angle of incidence to a surface of one of the substrate and the filter layer for producing a first filtered beam in accordance with a first spectral filtering function having a resonant response at a resonant response wavelength. At least one detector detects the first filtered beam to produce a first detected signal representative of the intensity of the first filtered beam. An error circuit in electrical communication with the detector produces, responsive to the detected signal, an error signal responsive to the deviation of the wavelength of the monitored beam from a set point wavelength. The selected nonzero angle of incidence is chosen such that the spectral filter function defines a capture range of wavelengths that includes the set point wavelength.

Also provided by the invention is an apparatus for monitoring the wavelength of laser radiation that includes a beam splitting apparatus disposed for splitting first and second split beams from a monitored beam; a first optical filter for receiving the first split beam and for producing therefrom a first filtered beam in accordance with a first spectral filtering function; a second optical filter for receiving the second split beam and for producing therefrom a second filtered beam in accordance a second spectral filtering function differing from the first spectral filtering function; first and second photodetectors for receiving at least a portion of the first and second filtered beams respectively, and for producing therefrom, respectively, first and second detected signals; and an error circuit for producing, responsive to the first and second detected signals, an output signal representative of the deviation of the monitored wavelength from a set point wavelength.

The error circuit includes a summing circuit for summing the first and second signals to produce a summed signal; a first circuit element for determining a first ratio of a first reference voltage to the summed signal; and a second circuit element responsive to the first circuit element for multiplying the second signal by a factor substantially equal to the first ratio to produce an output signal representative of a ratio of the second signal divided by the sum of the first and second signals.

According to a further feature of the invention, an error circuit is provided for producing a signal responsive to a ratio of first and second signals, where the first and second signals are representative of the intensity of first and second optical beams, respectively. The error circuit includes a summing circuit for summing the first and second signals to produce a summed signal, a first circuit element for determining a first ratio of a first reference voltage to the summed signal, and a second circuit element responsive to the first circuit means for multiplying the second signal by a factor substantially equal to the first ratio to produce an output signal representative of a ratio of the second signal divided by the sum of the first and second signals.

In yet an additional further aspect, the invention provides an apparatus for monitoring the wavelength of laser radiation that includes an optical filter for receiving a beam of laser radiation and for transmitting a first filtered beam in accordance with a first spectral filter function. In addition, the optical filter reflects a second filtered beam in accordance with a second spectral filter function inversely related to the first spectral filter function, the spectral filter functions crossing at first and second zero bias set points. The optical filter includes a substrate having a filter layer on a first surface thereof, the filter layer including at least one film layer having a dielectric constant differing from that of the substrate. A beam comparing element compares the intensities of the first and second filtered beams for producing a signal responsive to the deviation of the wavelength of the beam from a set point wavelength.

In another aspect, the invention includes an apparatus for monitoring the wavelength of laser radiation, comprising an optical filter for receiving spatially separated first and second beams of laser radiation and for, responsive to the first beam, transmitting a first filtered beam in accordance with a first spectral filter function and reflecting a second filtered beam in accordance with a second spectral filter function inversely related to the first spectral filter function. The first and second filter functions cross at first and second zero bias set points, and the optical filter is further responsive to the second beam for transmitting a third filtered beam in accordance with the first spectral filter function and reflecting a fourth filtered beam in accordance with the second spectral filter function. The optical filter includes a substrate having a filter layer on a first surface thereof, the filter layer including at least one film layer having a dielectric constant differing from that of the substrate. The first and second optical detectors receive the first and second filtered beams, respectively, and produce first and second detected signals. Third and fourth optical detectors receive the third and fourth filtered beams, respectively, for producing third and fourth detected signals. A first error circuit produces, responsive to the first and second detected signals, a first error signal responsive to the difference between the wavelength of the first beam of radiation and at least one of the first zero bias set point and a set point biased therefrom. The second error circuit for produces, responsive to the third and fourth detected signals a second error signal responsive to the difference between the wavelength of the second beam and at least one of the second zero bias set point and a set point biased therefrom.

A method of calibrating a laser wavelength monitoring apparatus is also provided by the present invention. The method includes the steps of A. operating a laser at a first wavelength provide a laser beam having the first wavelength;

B. filtering at least a first portion of the laser beam with a first optical filter to produce a filtered beam in accordance with a first spectral filter function having a resonant response at a resonance response wavelength;

C. measuring the intensity of the first filtered beam;

D. filtering at least a second portion of the laser beam with a second optical filter to produce a second filtered beam, the second optical filter including a substrate having a filter layer thereon, the filter layer including at least one film layer having an index of refracting different from that of the substrate, the step of filtering including directing the beam of radiation such that it is incident on a surface of at least one of the substrate and the filter layer at a selected angle of incidence;

E. monitoring the measured intensity of the second filtered beam;

F. selecting a final angle of incidence, the step of selecting including adjusting the angle of incidence of the laser beam to the surface such that the intensity of the second filtered beam is substantially equal to the measured intensity of the first filtered beam.

The final angle is further selected such that the first and the second spectral filter functions define a range of wavelength within which a signal responsive to the deviation of the wavelength of the laser from the first wavelength can be produced by comparing the intensities of the first and second filtered beams.

The present invention thus provides a laser wavelength monitoring and/or control apparatus that is stable under changing environmental conditions and insensitive to aging effects, in part due to the use of plate optical filters whereby the film layers are deposited with a high energy deposition process. A wavelength monitoring apparatus according the invention is intended to be economically and relatively easily incorporated into laser communication system, such as DWDM systems, for tuning and stabilizing the channel wavelengths.

The foregoing and other objects, advantages and features of the invention will be apparent from the following description and the accompanying drawings, in which like reference numbers refer to like parts throughout the views. The drawings illustrate principles of the invention, though not drawn to scale.

BRIEF DESCRIPTION OF THE DRAWINGS

FIG. 6 illustrates the variation of the set point wavelength and error signal by varying relative gain of the first and second amplifiers of the error circuits of the FIG. 5.

FIG. 7A illustrates mechanically varying the angle of incidence of a beam on a surface of the first optical filter of FIG. 2 for varying the spectral filter function, including the resonant response wavelength thereof.

FIG. 7B illustrates fixing first optical filter of FIG. 3A in place using laser welding.

FIGS. 9A and 9B illustrates examples of the beamsplitter apparatus illustrated in FIG. 8.

DETAILED DESCRIPTION OF THE PREFERRED EMBODIMENTS

Figure 1:
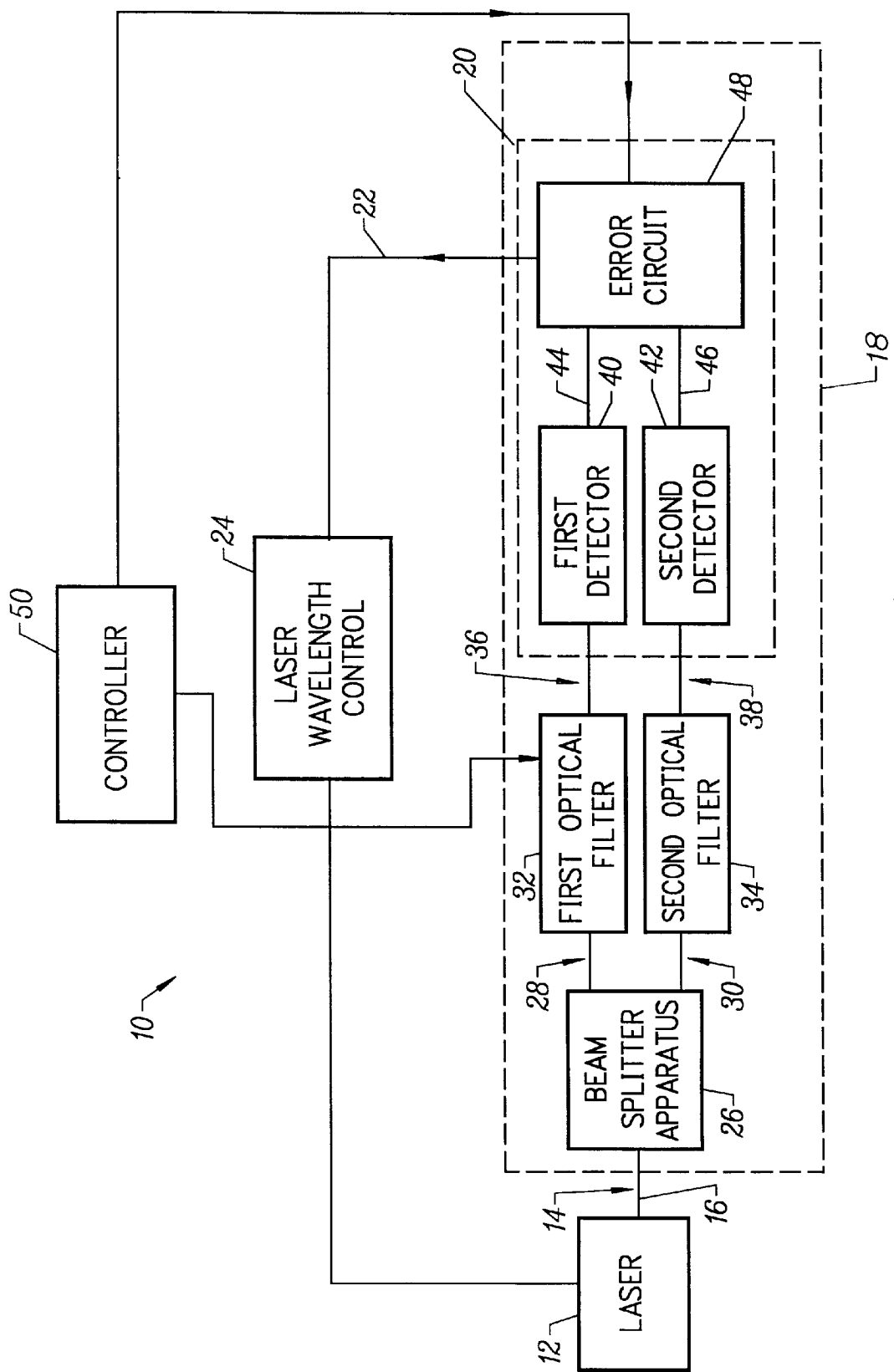
FIG. 1 is a block diagram of laser system including a laser wavelength monitoring apparatus according to the present invention.

FIG. 1 illustrates generally a laser system 10 incorporating a wavelength monitoring apparatus 18 according to the present invention. A laser 12 radiates a beam 14 to be monitored along an optical path 16, which can be a free-space optical-path, or defined by an optical waveguide, such as an optical fiber. The wavelength monitoring apparatus 18 receives the monitored beam 14 and produces an error signal responsive to the deviation of the wavelength of the monitored beam 14 from a selected set-point wavelength. The wavelength monitoring apparatus 18 communicates the error signal, as indicated by reference numeral 22, to a laser wavelength controller 24 that, responsive to the error signal, controls the wavelength of the monitored beam 14 to reduce the error signal, thus driving the wavelength of the monitored beam 14 to tend towards the set-point wavelength. The laser wavelength controller 24 can, for example, control the temperature of the laser 12 or the excitation current supplied to the laser 12. If the laser 12 is a Distributed Feedback (DFB) laser, as is often used in a Dense Wavelength Division Multiplexed (DWDM) laser communication system, the laser controller 24 preferably controls the temperature of the laser source 12.

Typically, the wavelength of a DFB laser will change about 0.1 nm/°C. Therefore, if the operating temperature is controlled to vary over a 20° C. range, it should be possible to vary the laser wavelength over a 2.0 nm span. As the wavelength drift of a DFB laser is typically not predictable, the set-point wavelength is typically selected to correspond to the center of this span as the safest operating point for long-term wavelength control of the laser source 12.

A controller 50, such as a personal computer or dedicated microprocessor, can be included for varying the set-point wavelength. Varying the set-point wavelength allows the wavelength of the laser 12 to be tuned, as is described in more detail hereinafter.

The wavelength monitoring system 18 can include a beamsplitter apparatus 26 for splitting the monitored beam 14 into first and second split beams, 28 and 30 respectively. A first optical filter 32 filters the first split beam 28 according to a first spectral filter function to produce a first filtered beam 36; a second optical filter 34 filters the second split beam 30 according to a second spectral filter function, which differs from the first spectral filter function, to produce a second filtered beam 38. A beam comparison element 20 receives and processes the filtered beams to produce the error signal for communication to the laser wavelength controller 24. Typically, the beam comparison element subtracts or takes a ratio of the filtered beams 36 and 38.

The first and second spectral filter functions differ such that the beam comparison element 20 can, by comparing the filtered beams 36 and 38, produce an error signal responsive to the deviation of the wavelength of the monitored beam 14 from the set-point wavelength. For example, as is discussed in more detail hereinafter, one useful spectral filter function can be characterized as having a bandpass bandwidth and a resonant response, at which the filtered beam transmitted or reflected from the filter is the least or most intense, at least locally. The resonant response occurs at a resonant response wavelength. If the resonant response wavelength of the first spectral filter function is shifted from the resonant response wavelength of the second spectral filter function, a useful error signal, responsive to the deviation of the wavelength of the monitored beam 14 from the set-point wavelength, can be derived by the beam comparison element 20 from the first and second filtered beams, 36 and 38 respectively. The set-point wavelength can correspond to the wavelength at which the spectral filter function cross, referred to herein at the crossing wavelength. Particular spectral filter functions are discussed in more detail hereinafter.

Accordingly, the beam comparison element 20 can include a first optical detector 40, a second optical detector 42, and an error circuit 48. The first optical detector 40 detects the first filtered beam 36, communicating a first detected signal, as indicated by reference number 44, to the error circuit 48. Similarly, the second optical detector 42 detects the second filtered beam 38 communicating a second detection signal, as indicated by reference number 46, to the error circuit 48. The error circuit 48 combines the detected signals, such as by taking a ratio involving the signals or subtracting the signals, to produce the error signal.

As indicated in FIG. 1, the controller 50 can communicate with the error circuit 48 and/or one of the optical filters, such as the first optical filter 32, to control, respectively, the first spectral filter function and the combining of the detected signals, for varying the set-point wavelength. A set point wavelength that differs from the crossing wavelength, when the concept of a crossing wavelength is relevant, is referred to herein as a biased set point wavelength; the term set point wavelength includes both set points that are crossing point wavelengths and set point wavelengths biased therefrom. As discussed further below, a single SFF can be used for generating an error signal that is responsive to the deviation of the laser wavelength from a set point wavelength, though there is no crossing of SFF's and hence no relevant crossing wavelength.

Figure 2:
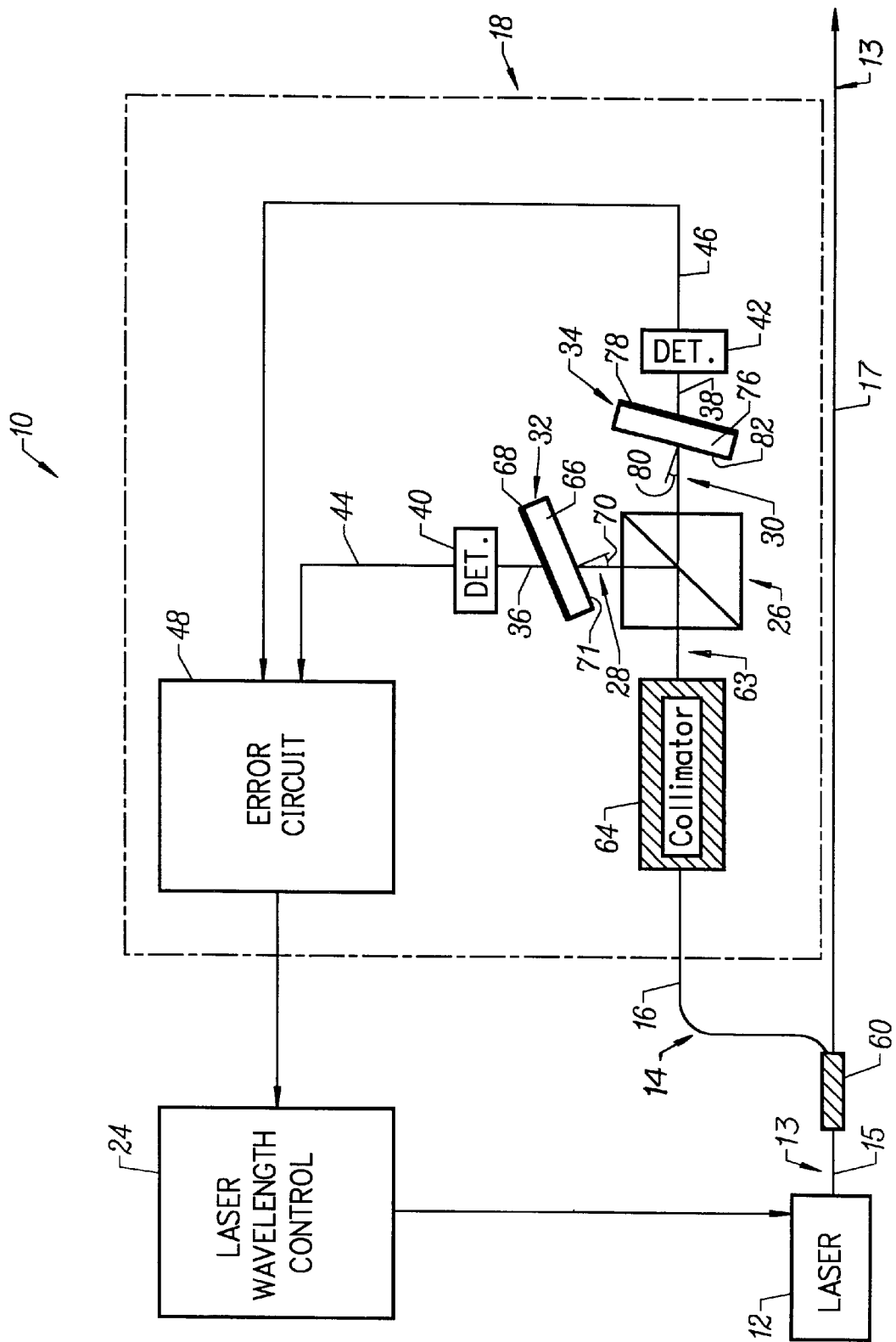
FIG. 2 is a schematic illustration of one embodiment of the laser system and laser wavelength monitoring apparatus of FIG. 1.

FIG. 2 illustrates one embodiment of a laser system 10 incorporating a wavelength monitoring apparatus 18 according to the present invention. The laser 12 generates a main beam 13 along a optical path 15 defined by an optical fiber. A fiberoptic coupler 60 couples a portion of the main beam 13 along an optical path 16, also defined by an optical fiber, as the monitored beam 14. The main beam 13 exits to the right of FIG. 2 along optical path 17, for further processing, such as modulation with a telecommunications signal.

The fiber optic collimator 64 collimates the monitored beam 14 to travel the free space optical path 63 to the beam splitter apparatus 26, in this instance a typical free-space beam splitter known to those of ordinary skill in the art. The beam splitter apparatus 26 splits the monitored beam 14 into first and second split beams, 21 and 30, respectively, that are filtered by first and second plate optical filters 32 and 34.

The first and second optical filters, 32 and 34 respectively, are plate filters including substrates 66 and 76, respectively, having filter layers 68 and 78, respectively, deposited thereon. Filter layer 68 is discussed as generally representative of both the filter layers 68 and 78. The filter layer 68 includes at least one film, typically having an optical length of a quarter wave at a selected wavelength, and having a dielectric constant, or equivalently, an index of refraction, differing from that of the substrate 66 or from one of any other films that make up the filter layer 68.

As shown in FIG. 2, the first split beam 28 is incident at selected angle 70 to a surface 71 of the first plate optical filter 32. The second plate optical filter 34 can also be disposed such that the second split beam is incident on surface 82 of the second filter at an angle 80. The spectral filter function of a given plate filter is a function of the substrate, the filter layer, and the angle of incidence the optical beam incident on a surface of the filter.

Figure 3A:
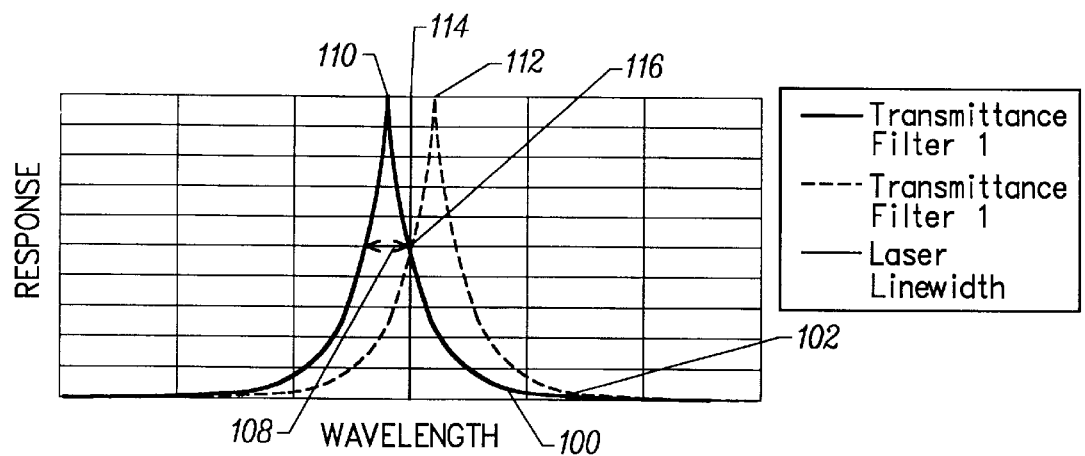
FIG. 3A illustrates typical first and second spectral filter functions corresponding to the first and second optical filters of FIG. 2.

FIG. 3A illustrates a first spectral filter function (SFF) 100 (indicated by a solid line) associated with the first optical filter 32 and a second SFF function 102 (indicated by a dotted line) associated with the second optical filter 34. Each SFF can be characterized as having a bandwidth, such as the width 108 at half height for the first SFF 100, and a resonant response, such as the resonant response 110 for the first SFF 100 and the resonant response 112 for the second SFF 102, at which the first and second filtered beam, 44 and 46 respectively, are the most intense. The first and second SFF's differ primarily in that the wavelengths corresponding to the resonant response for each SFF are shifted from each other.

Figure 3B:
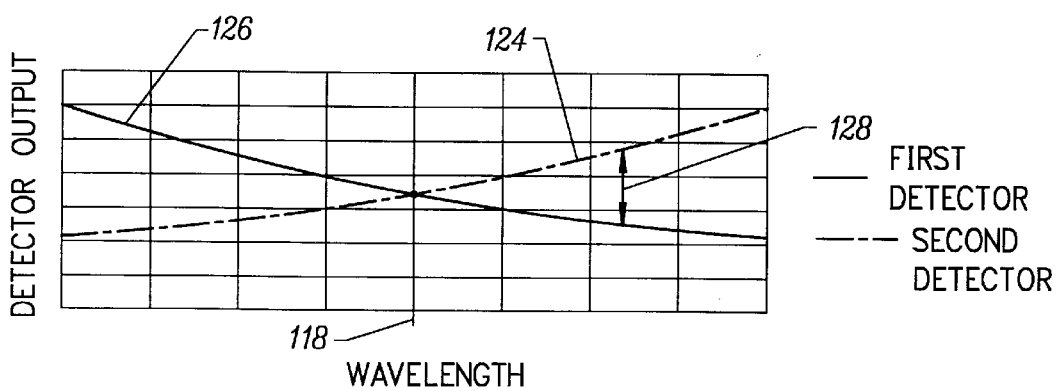
FIG. 3B illustrates the derivation of an error signal from the spectral filter functions of FIG. 3A.

The first SFF and second SFF cross at point 116 at the crossing wavelength indicated by reference numeral 118, which can correspond to the set-point wavelength. For example, at the operating wavelength of the laser 12, represented by the spectral line 114 in FIG. 3A, the first and second spectral filter functions, and hence the intensity of the first and second filtered beams, are equal. However, as the monitored wavelength 114 shifts to either side of the wavelength point 118, either the first SFF increases and the second SFF decreases, or vice versa. Thus a beam comparison element 20 that subtracts or takes a ratio of signals, such as the first and second detected signals can produce an error signal responsive to the deviation of the wavelength 114 from the set point wavelength 118. FIG. 3B illustrates the variation of the first and second detected signals, 126 and 124 respectively, as a function of wavelength. The error circuit 48 can be a differencing circuit for taking the difference 128 between the first detected signal 126, indicated by a solid line, and the second detected signal 124, indicated by the dashed line. Such differencing error circuits are discussed in conjunction with FIG. 5.

One of ordinary skill in the art, in light of the disclosure herein, understands that different types of optical filters can operate, to provide a spectral filter function, in different manners. For example, light energy can be absorbed, reflected, or transmitted by an optical filter. The energy not absorbed is either transmitted or reflected, or both, and a filtered beam can correspond to a beam reflected, rather that transmitted, from a filter. Accordingly, as used herein, a resonant response can refer to a local or global maxima or minima (i.e. null) of a spectral filter function, and a filtered beam can include a beam reflected or transmit from an optical filter.

With reference again to FIG. 2, the first and second optical detectors, 40 and 42, respectively, are preferably PIN photodetectors operated in photo-voltaic mode to reduce the effects of dark currents. Accordingly, the optical filters 32 and 34 and the detectors 40 and 42 function as a wavelength-to-voltage transducer. The error circuit 48 processes first and second detected signals and produces an error signal 22 wherein the voltage of the signal is representative of the deviation of the wavelength of the monitored beam 14 (and hence of the main monitored beam 13) from the set-point wavelength. One of ordinary skill in the art, possessed of the disclosure herein; appreciates that the PIN photodetector 40 and 42 can also be operated in a photoconductive mode, such that the photodetectors 40 and 42 and optical filters 32 and 34 act as a wavelength-to-current transducer.

Varying the angle of incidence of a beam on a plate filter primarily shifts the wavelength corresponding to the resonant response of the SFF. Thus the first and second plate filters can be substantially physically identical, yet have the distinct spectral filter functions 110 and 112 because the filters are disposed at an angle to the respective beams incident thereon. Disposing the first or second, or both, plate filters at angle to an incident beam to vary the SFF of the filter is referred to herein as angle tuning, and can have significant benefits. For example, a 16 channel laser communication system having 16 laser sources, each operating at a different wavelength, can require 32 distinct spectral filter functions, (2 per laser wavelength, as in FIG. 2), and hence, in typical prior art systems, 32 physically distinct plate filters having different filter layers and/or substrates, to provide wavelength monitoring and control. However, using angle tuning according to the invention to vary the SFF of the plate filters, such a laser system may require as few as 3 or 4 physically distinct plate filters to obtain the 32 distinct spectral filter functions.

Figure 4A:
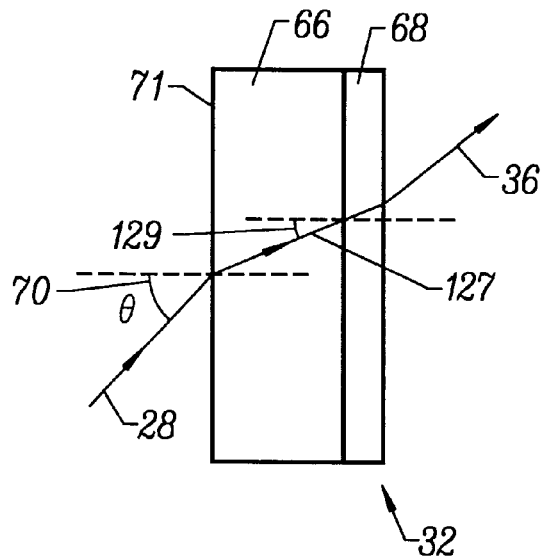
FIG. 4A illustrates the geometry of an optical beam incident on the optical filter of FIG. 2, and is useful in understanding the phenomenon of angle tuning a spectral filter function of FIG. 3A.
Figure 4B:
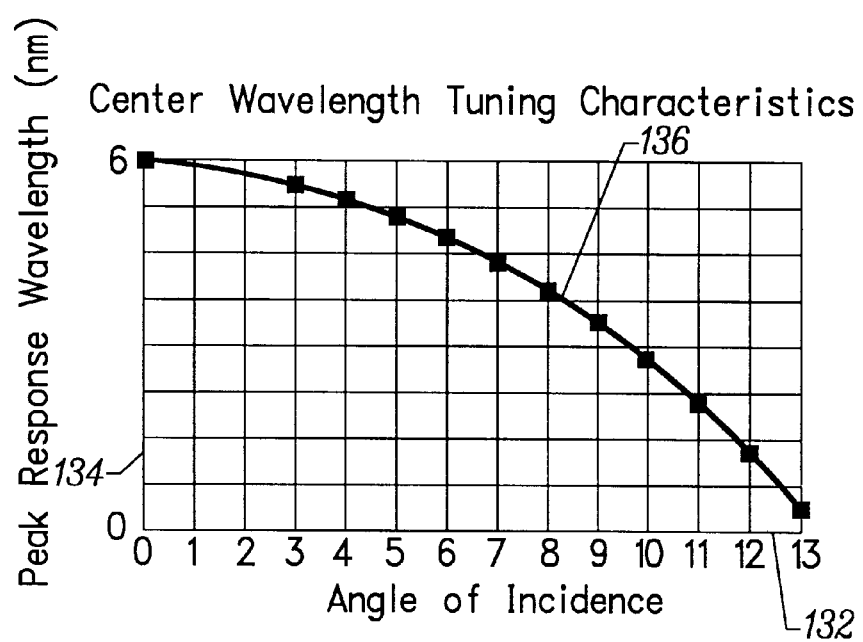
FIG. 4B illustrates the tuning of the resonant response wavelength of a spectral filter function as a function of the angle of incidence of the incident beam of laser radiation.

The variation of a spectral filter function of a plate filter with incident angle is illustrated in FIGS. 4A and 4B. Varying the angle of incidence 70 of an optical beam, such as the first split beam 28, on a surface 71 of an optical plate filter, such as the optical filter 32, varies the resonant response wavelength of the spectral filter function of the optical filter 32.

The resonant response wavelength is inversely proportional to the incident angle 129 of the beam 127 traveling in the optical filter 32, obeying the following relationship:

resonant response wavelength $\alpha \lambda_0 \cos(\emptyset_i)$

Where $\emptyset_i$ is the angle of incidence 129 of the beam 127 traveling within the optical filter 32 on the film layer 68, and $\lambda_0$ is the resonant response wavelength when the angle of incidence 129 on the film layer 68 is 0 degrees. The angle of incidence 129 of the beam 127 on the film layer 68 on the film layer 68 is related to the incident angle 70 on the substrate 66 by Snell's law.

$\emptyset_i = \sin^{-1}(1/n (\sin(\emptyset)))$

Where $\emptyset$ is the angle of incidence 70 of the beam 28 on the substrate 66 and n is the index of refraction of the substrate 66.

FIG. 4B illustrates the functional relationship 136 between the resonant response wavelength and the angle of incidence 70. Reference number 132 refers to the horizontal axis, representing in degrees and reference number 134 refers to the vertical axis, in manometers. Varying the incident angle 70 over approximately 13 degrees varies the resonant response wavelength over approximately 6 nanometers. A typical spectral filter function can have a 3 dB bandwidth of approximately 1 nanometer, as depicted in FIG. 3A.

Note that the tuning characteristics of the optical filter 32 are a function of the refractive index of the substrate 66. The change in the resonant response wavelength of the optical filter 32 can be made more or less sensitive to the angle of incidence 70 by varying the refractive index of the substrate 66. For example, for an incident angle 70 on the substrate 66 of 8° and a wavelength of 1550 nm, the resonant response wavelength of an optical filter 32 having a substrate 66 of fused silica shifts by approximately ~6.6 nm, whereas when the substrate 66 is $TaF_3$, the resonant response wavelength only shifts by −2.5 nm. Accordingly, the refractive index of the substrate 66 can be used as a design parameter to customize the performance of the wavelength-to-electrical signal transducer formed by the first and second optical filters 32 and 34 and the first and second detectors 40 and 42.

In addition, the bandpass, such as the bandpass 108 shown in FIG. 3A, can be varied by varying the filter layer 68 to make the optical filter 32 more or less sensitive to changes in the wavelength of the monitored beam 14. One of ordinary skill in the art, in light of the disclosure herein, understands that spectral filter function is related to the individual layer(s) that form the filter layer 68 on the substrate 66. The number of layers, the wavelength at which the layers are a quarter wave long, and the dielectric constant of each of the layers all effect the spectral filter function. To decrease the sensitivity of the optical filter 32, the bandpass of the spectral filter function can be broadened, thus flattening the slope of the detected signal 44 relative to a deviation of the wavelength of the monitored beam 14 from the resonant response wavelength.

According to the invention, plate filters are advantageous for wavelength monitoring and control for reasons additional to reducing the number of physically distinct filters required. One object of the present invention is to provide a wavelength monitoring apparatus that provides a stable and repeatable output over time, even when subject to varying environmental conditions. The filter layers 68 and 78 of the first and second optical filters 32 and 34 can be fabricated via the deposition of multiple dielectric quarter wave layers using an energetic deposition process such as ion beam or ion assisted sputtering on the optical substrate 66. Such energetic deposition processes can produce films that have packing densities close to unity and hence which are very robust relative to changing environmental conditions and aging.

Furthermore, the spectral filter function (SFF) of a plate filter is readily changed by changing the number and physical makeup filter, i.e. the dielectric constant and thickness, of the layers that make up the filter layer 68 on the substrate 66 and of the substrate 66. Thus the SFF can be easily changed to tailor a design for different applications. In addition, plate filters are typically produced repeatably and at low cost.

The error circuit 48 preferably provides an error signal 22 that approaches zero when the wavelength of the monitored beam 14 is equal to the set-point wavelength. Preferably, the wavelength set point is maintained constant for many years, over a wide temperature range, and over a reasonable range of optical power levels. One suitable approach is to apply a selected gain to each the first and second detected signals, 44 and 46, and to obtain the error signal by subtracting the first detected signal from the other, or vice versa. If the gain applied to the first and second detected signal are variable, it is possible to vary the wavelength set point to produce a biased set point wavelength, and to control the operating wavelength of tile laser 12 over a selected range.

Figure 5C:
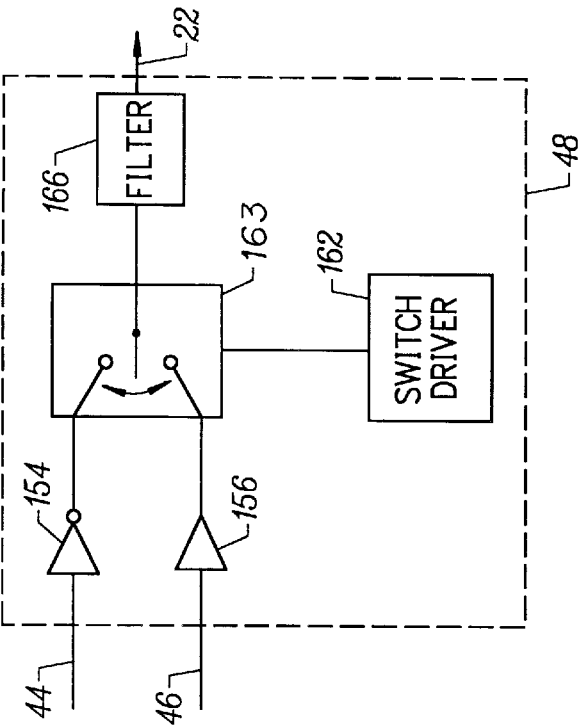
FIGS. 5A–5D schematically illustrate differencing error circuits for producing an error signal in accordance with the present invention, such as illustrated in FIGS. 1 and 2.
Figure 5A:
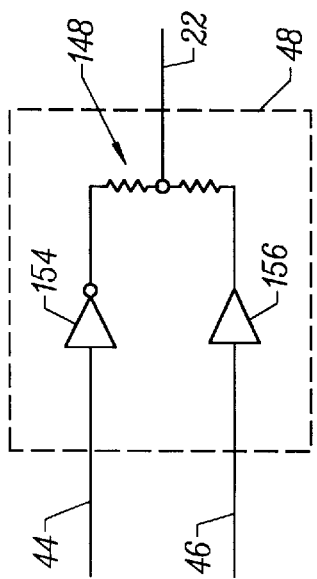
Figure 5B:
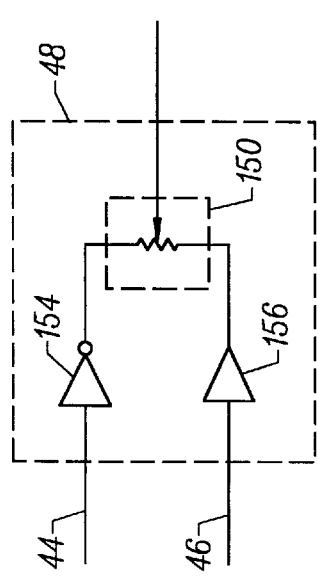
Figure 5D:
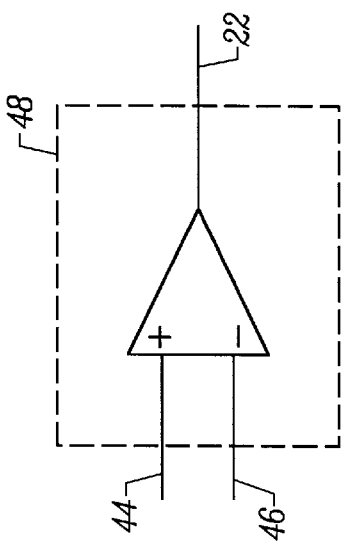

FIGS. 5A–5D illustrate differencing error circuits 28. Op amps 154 and 156 are configured as transconductance amplifiers and amplify, respectively, the first and second detected signals 44 and 46. The output of the op amp 154 is inverted. In FIG. 5A, the first and second detected signals are differenced with a simple two-resistor network 48. In FIG. 5B, the two resistors are configured as a potentiometer. Adjusting the potentiometer varies the gain of one detector signal with respect to the other, for biasing the set-point and hence varying the operating wavelength of the laser 12. The potentiometer 150 can be a conventional potentiometer or a digital potentiometer. In FIG. 5C, a driver 162 drives an analog switch 154 to rapidly switch back and forth between the first and second detected signals, 44 and 46, and the filter 166 filters the signal received from the switch 154. There are two advantages to this approach: first, the drift of one signal channel relative to the other is minimized, and second, the wavelength set-point can be biased by changing the duty cycle of the switch driver 162.

FIG. 6 illustrates the error signal produced by a typical differencing error circuit as a function of the gain of the transconductance op amps 154 and 156. The horizontal axis represents wavelength and the vertical axis the strength of the error signal 22. The curve 172 corresponds to equal gain of the first and second op amps, 154 and 156, respectively; the curve 174 corresponds to the second op amp 156 providing twice the gain of the first op amp 154; and the curve 176 corresponds to the first op amp 154 providing twice the gain of the second op amp 156. Note the biasing of the wavelength set point. For example, if the wavelength set point corresponds to a error signal of zero, the set point varies from the wavelength set point 188 for equal gain to the biased set point 178 for the curve 176.

Reference numeral 173 indicates the wavelength tuning range corresponding to the equal gain curve 172. The term "tuning range," as used herein, indicates a range of wavelengths over which a unique error signal is produced for monitoring and/or controlling the wavelength of the monitored beam 14, and hence of the laser 12. As understood by one of ordinary skill, in light of the disclosure herein, the tuning range 173 for the equal gain curve 173 can be determined by the separation in wavelengths between the resonant response wavelengths corresponding to the resonant responses 110 and 112 of the first and second spectral filter functions, 100 and 102 respectively, in FIG. 3A. Outside of the tuning range a given value of the error signal can correspond to more than one wavelength of the monitored beam, and the error signal does not uniquely represent the deviation of the wavelength of the monitored beam from the set point wavelength.

The task of tuning the wavelength of the laser or providing a simple wavelength to voltage (or current) transducer becomes more complicated for wavelengths outside of the tuning range. However, outside the tuning range, provision can made for determining whether the laser wavelength is on a negative or positive slope of a spectral filter function, or as appropriate, and error signal versus wavelength curve, so as to determine which of the more than one possible value of the error signal curve or SFF represents the wavelength of the laser.

However, it has been found that in wavelength stabilization applications, the capture range of laser wavelengths can be larger than the above defined tuning range. The capture range is that range of laser wavelength within which the wavelength of the laser can be "captured" and, via feedback of the error signal to the laser wavelength controller, driven to or near the set point wavelength. For example, for the curve 172, the capture range is at least as large as the whole range of wavelengths shown. Within the capture range, With reference to the curve 172, within the capture range the error signal is responsive to the deviation from the set point wavelength in that its of one polarity for laser wavelengths less than the set point wavelength and of an opposite polarity for signal greater than the set point wavelength. In addition, the error signal approaches zero as the laser wavelength approaches the set point wavelength.

FIG. 7A illustrates mechanically positioning the first optical filter 32 to vary the angle of incidence 70 of the first split beam 28 on the surface 71 of the substrate 66, thereby varying the first spectral filter function as discussed above. A support element 182, such as a shaft, supports the first filter 32 and is affixed thereto such as by the epoxy 185. The mount 187 rotationally couples the support element 182 to a frame or optical bed 179. The support element 182 includes an arm 188 for rotating the element 182 so as to vary the angle of incidence 70. The controller 50 can control a piezoelectric transducer 189 that "grows" or "contracts" in response to an applied voltage to rotate the first filter 32 as indicated by the arrow 184 to vary the angle of incidence 70. A second support element 190 can secure the piezoelectric transducer 189 to the frame 179. Varying the position, as indicated in FIG. 7A, of one or both of first and second optical filters 32 and 34 can vary the crossing wavelength, thus tuning the wavelength of the monitored beam, by varying the wavelength at which the first and second filter functions intersect or cross, i.e, varying the wavelength at which they are substantially equal. Alternatively, the first optical filter 32 can be mounted to a stepper motor for positioning the filter to vary the angle of incidence, and the stepper motor can be controlled by the controller 50.

One of ordinary skill appreciates, in light of the disclosure herein, that rather than vary the position of the first optical filter 32, the first plate optical filter 32 can be laser welded as in FIG. 7B, or otherwise secured, and a beam directing element for varying the angle of incidence 70 can be inserted, for example, upstream of the optical filter 32. The mechanical position of the beam directing element be varied, such as by a piezoelectric transducer 189 or a stepper motor, to vary the angle of incidence 70. Such modification is deemed within the scope of the invention.

FIG. 7B illustrates laser welding the support element 182 to the frame or optical bed 179 using a laser beam 191 to create the laser weld 192. The first filter 32 is typically manually rotated to obtain a desired SFF and then laser welded in place. Laser welding fixes the first filter support 182 to the frame 179 in a more robust and environmentally stable manner than prior art methods, such as soldering or using epoxy. The use of angle tuning, which reduces the number of different filters required for a given laser system, in conjunction with laser welding of the filters in place, is advantageous over prior art designs as it reduces the number of parts, simplifies the manufacturing process, and leads to less variation of the performance of a module 18 due to aging and environmental conditions, producing a more robust laser system 12 for use, for example, in DWDM systems.

For convenience, the first optical filter 32 is shown in FIGS. 7A and 7B as physically larger than the support element 182, though typically the reverse is true. Laser welding the support element 182 to the frame 179 is considered superior to prior art methods, such as epoxying or soldering, for securing the mass of the support element 182 and the first optical filter 32 to maintain the angle of incidence 70 over extended periods of time and changing environmental conditions. The epoxy 185 is acceptable for securing the first optical filter 32 to the support element 182, as such epoxy 185 need only secure the mass of the filter.

Figure 8:
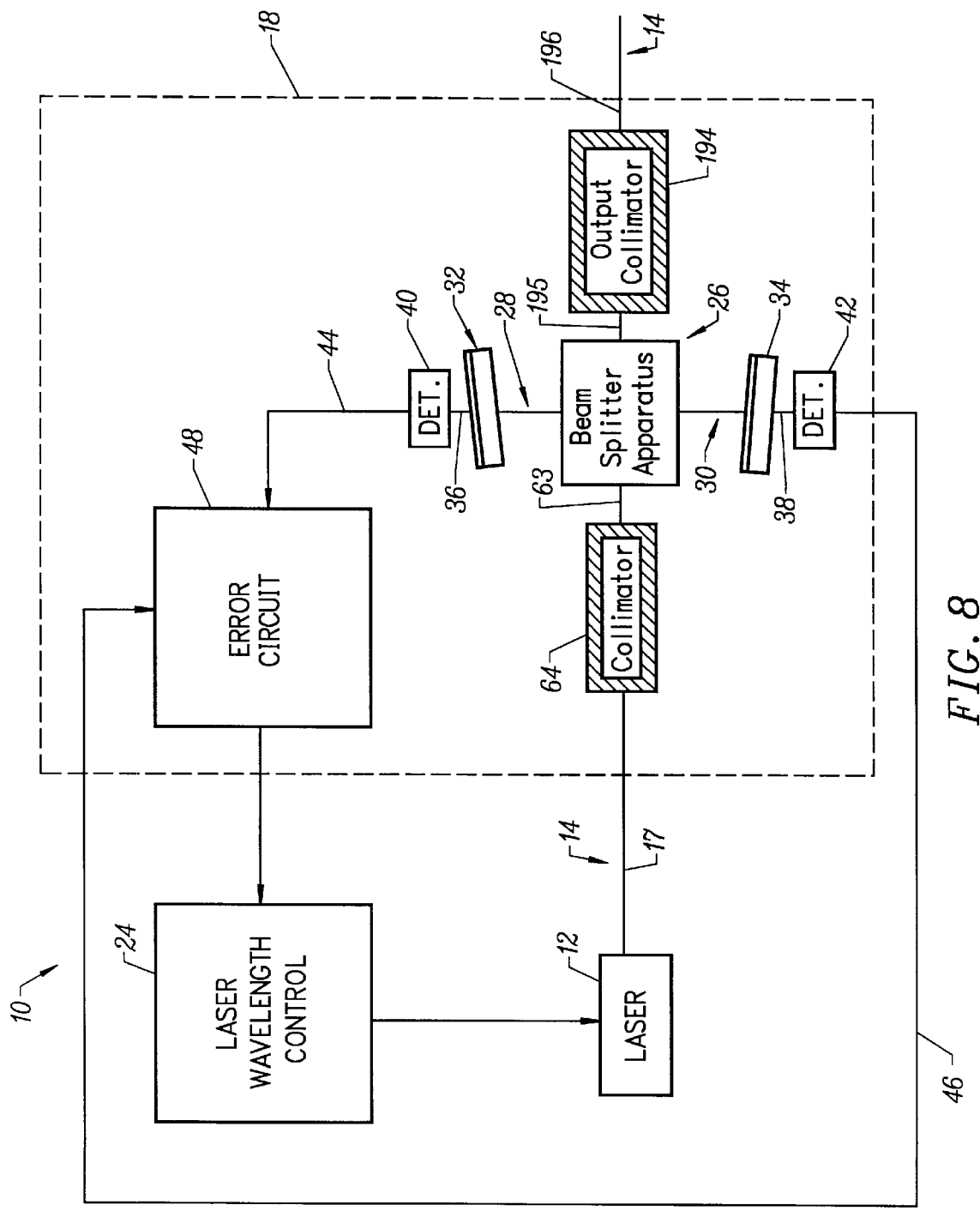
FIG. 8 illustrates an "in-line" alternative embodiment of the laser system including a wavelength monitoring system of FIG. 1.

FIG. 8 illustrates an alternative embodiment of the a wavelength monitoring apparatus 18 and of a laser system 10 incorporating such apparatus. The beam splitter apparatus 26, in addition to splitting the collimated monitored beam 14 traveling the free space optical path 63 into the split beams 28 and 30, transmits the monitored beam 14 along a free-space beam path 195, which can be substantially collinear with the free space beam path 63. The output collimator, disposed along the beam path 195, collects the monitored beam to travel along an optical waveguide 196. The optical waveguide 196 can convey the monitored beam 14 to a modulator for impression of a telecommunication signal on the beam. Such an "inline" design as of a monitoring apparatus 18 can advantageously readily be incorporated into practical laser systems, for example, as used in the Cable Television (CATV) industry.

FIGS. 9A and 9B show two beam splitter apparatus 26 suitable for use in the laser wavelength monitoring apparatus 18 of FIG. 8. In FIG. 9A, two free-space beamsplitters 200 and 204 cooperate as shown to split the monitored beam 14 propagating along the free-space path 63 into first and second split beams 28 and 30 respectively, and to transmit the monitored beam along the free-space output optical path 195. The first beam splitter splits the monitored beam 14 into the first split beam 28 and an intermediate beam 202; the second beam splitter 204 splits the beam 202 into the second split beam 30 and the monitored beam 14 traveling the optical path 195. Note that term "splitting," as used herein, does not necessitate that the power of an incident beam is split equally into the split beams by a beamsplitter. FIG. 9B illustrates a beamsplitter apparatus 26 wherein a single beamsplitter 203 has partially reflective surfaces 205 and 207 that cooperate to produce the beam 28 and 30, as well as to pass the monitored beam 14 along optical path 195.

Figure 10:
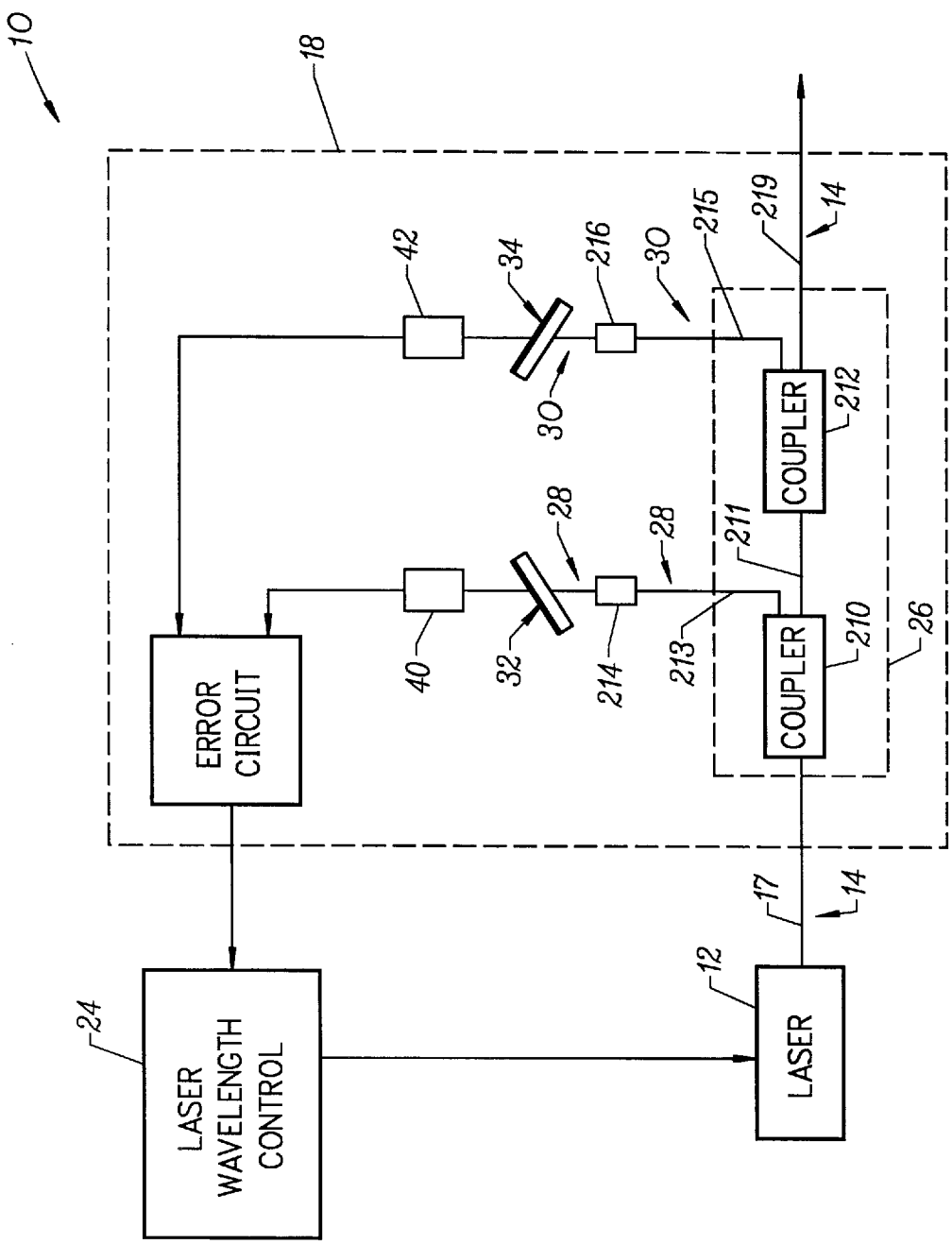
FIG. 10 illustrates another embodiment of the laser system and wavelength monitoring apparatus illustrated in FIG. 1.

FIG. 10 illustrates another embodiment of a laser wavelength monitoring apparatus 18 and a laser system 10 incorporating the apparatus 18. The beamsplitter apparatus 26 receives the monitored beam 14 propagating along an optical fiber 17. A first fiber optic coupler 210 splits the first split beam 28 from the monitored beam. A second fiber optic coupler 212 receives the monitored beam from the first optical fiber coupler 210 via an optical fiber 211 and splits off the second split beam 34 to propagate along an optical fiber 215. The monitored beam 14 exits the second optical fiber coupler 212 along the optical fiber 219. Collimator 214 and 216 collimate the first and second split beam before the beams are filtered, respectively, by the first and second optical filters 32 and 34.

Figure 11A:
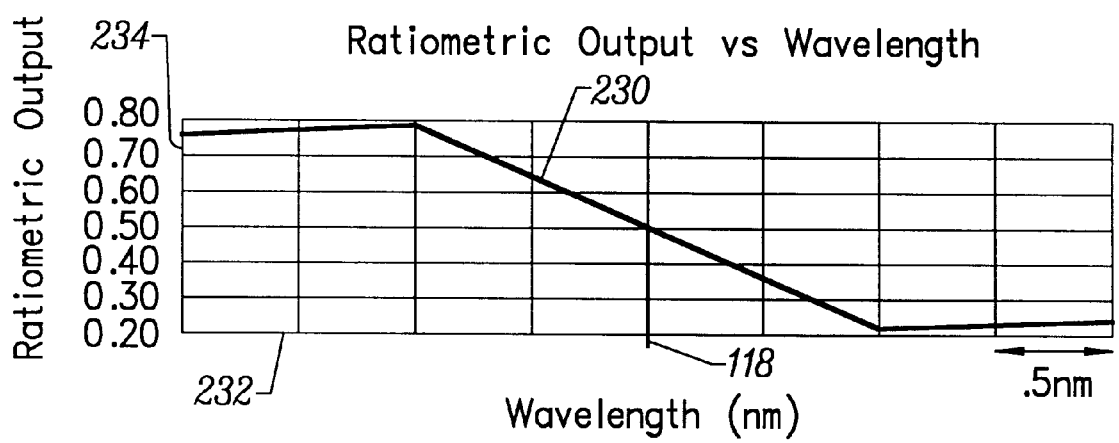
FIG. 11A illustrates the error signal of FIG. 1 as derived from a ratio of the outputs of the first and second detectors of FIG. 1.

Returning briefly to FIG. 3B, a useful error signal can be derived not only by subtracting the first and second detected signals, 44 and 46, but by taking a ratio of the signals as well. In FIG. 11A, the curve 230 graphically illustrates deriving an error signal from the ratio of the first detected signal to the sum of the first and second detected signals. The vertical axis 234 is the value of the above ratio and the horizontal axis 232 is wavelength. A ratio of ½ can correspond to the crossing wavelength 118.

Figure 11B:
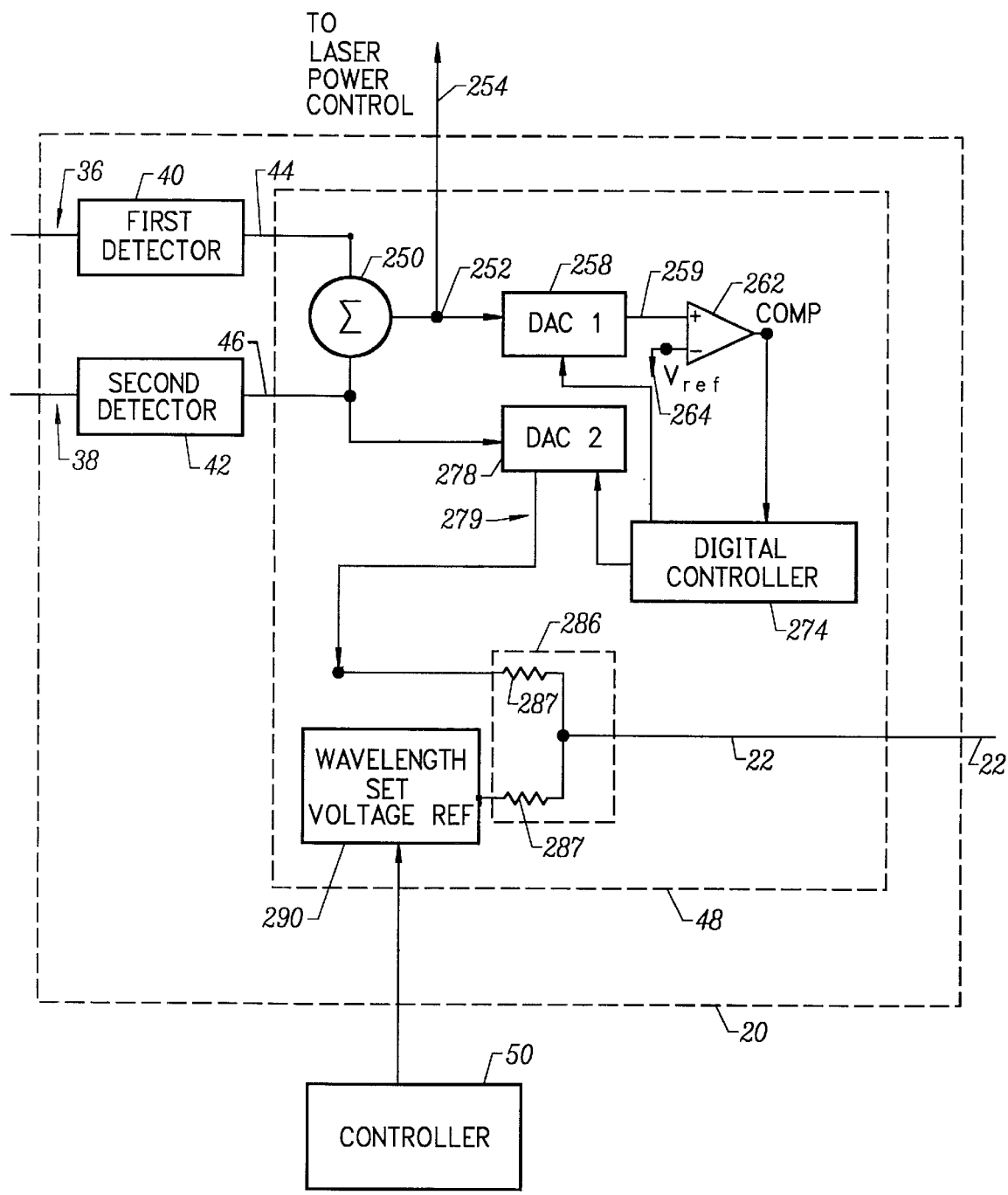
FIG. 11B illustrates one error circuit for producing the error signal bit taking the ratio indicated in FIG. 11A.

FIG. 11B illustrates a beam comparing element 20 including a preferred embodiment of an error circuit 48 for ratioing the first and second detected signals 44 and 46. The summer 250, which can be a simple two resistor network, sums the first and second detected signals 44 and 46. One advantage of using the sum of the first and second detected signals in a ratio is that the voltage at point 252 is proportional to the total power being radiated by, for example, the laser 12 of FIG. 1, and can be made available, as indicated by reference number 254, for external use, such as in a leveling circuit for stabilizing the power output of a system laser 12. A differencing error circuit, such as the circuits of FIGS. 5A–5D, do not typically provide such a signal.

The digital controller 274 senses the output of the comparator 262 to adjust the gain of the first digital-to-analog converter (DAC) 258 such that the output voltage 259 of the first DAC 258 supplied to the plus input of the comparator 262 is equal to a reference voltage Vref 264 provided to the negative input of the comparator 262. Accordingly, the gain of the first DAC 258, G1, multiplied by the sum of the first and second detected signals is equal to the voltage Vref.

$Vref$=(first detected signal 44+second detected signal 46)×$G1$

The digital controller 274 controls the second DAC 278 such that gain G2 of the second DAC 278 applied to the second detected signal 44 is equal to the gain G1 of the first DAC 278. Thus $G1$=$G2$=$Vref$/(first detected signal 44+second detected signal 46)

and the voltage output 279 of the second DAC 278 is second detected signal 46×$G1$=(second detected signal 46×$Vref$)/(first detected signal 44+second detected signal 46)

A combiner 286, which can be a simple two resistor network including resistors 287, adds the output of the second DAC 278 to a set-point reference voltage (which is typically negative) provided by a set-point voltage reference supply 290 to provide the error signal 22.

Figure 12:
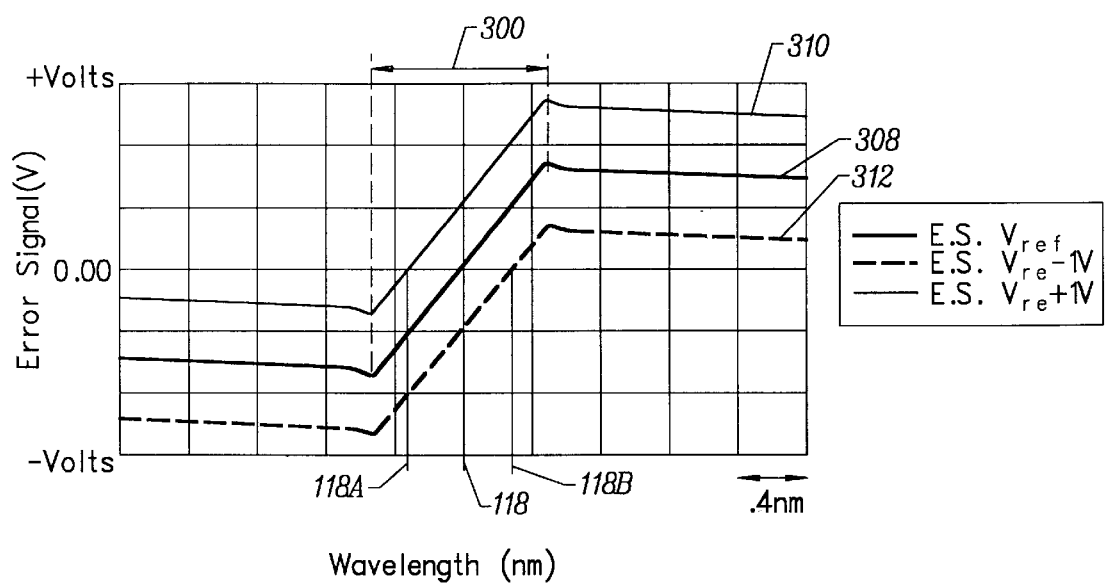
FIG. 12 illustrates varying the set point wavelength and the error signal by adjusting the set-point reference voltage of the ratioing error circuit of FIG. 11B.

FIG. 12 illustrates the biasing of the set point wavelength as a function of the voltage of the set-point reference voltage 290. Increasing the voltage of the set-point reference voltage 290 shifts the curve 308 to the curve 310, and the set point 110 to the point 118A. Decreasing the wavelength reference voltage shifts the curve 308 to the curve 312, such that the wavelength set voltage shifts to the point 118B. Note that the curves 308, 310 and 312 are evenly spaced and not compressed as the curves 172, 174, and 176 of FIG. 6, illustrating an advantage of the ratio error circuit of FIG. 11A. Reference numeral 300 indicates the tuning range of the error signal curve 308, wherein the term tuning range, as used herein, indicates a range of wavelengths over which a useful error signal is produced for monitoring and/or controlling the wavelength of the monitored beam 14, and hence of the laser 12. As indicated in FIG. 11B, the controller 50 can control the supply 290 for biasing the set-point wavelength.

In addition to the above-stated advantage, the ratio error circuit 28 of FIG. 11B is considered to have certain other advantages over the differencing error circuits of FIGS. 5A–5D. A signal 254 is available that is proportional to the total power radiated by the laser 12. The range over which the error voltage 22 varies is less affected by changes in the optical power of the of the laser 12, and hence of the first and second filtered beams 36 and 38. Thus the control of the laser 12 via the provision of the error signal 22 to the laser controller 24 is not as affected by variations in optical power. Furthermore, the first DAC 258 and the second DAC 278 can be matched and will typically perform repeatably for extended periods, thereby providing a stable wavelength set-point.

Regarding the generation of the error signal 22, one of ordinary skill in the art, in light of the disclosure herein, understands that the error signal 22 can undergo additional processing as part of its provision to the laser wavelength controller 24. Typically, such processing includes amplification and/or integration of the signal. An integrator can be included for reducing residual error in the error signal that can otherwise be present when the wavelength of the monitored beam 14, or equivalently, of the laser 12, is close to the set-point wavelength and the error signal is small. The above considerations apply to the error circuits discussed in conjunction with FIGS. 5A–5D as well.

Figures 13A, 13B:
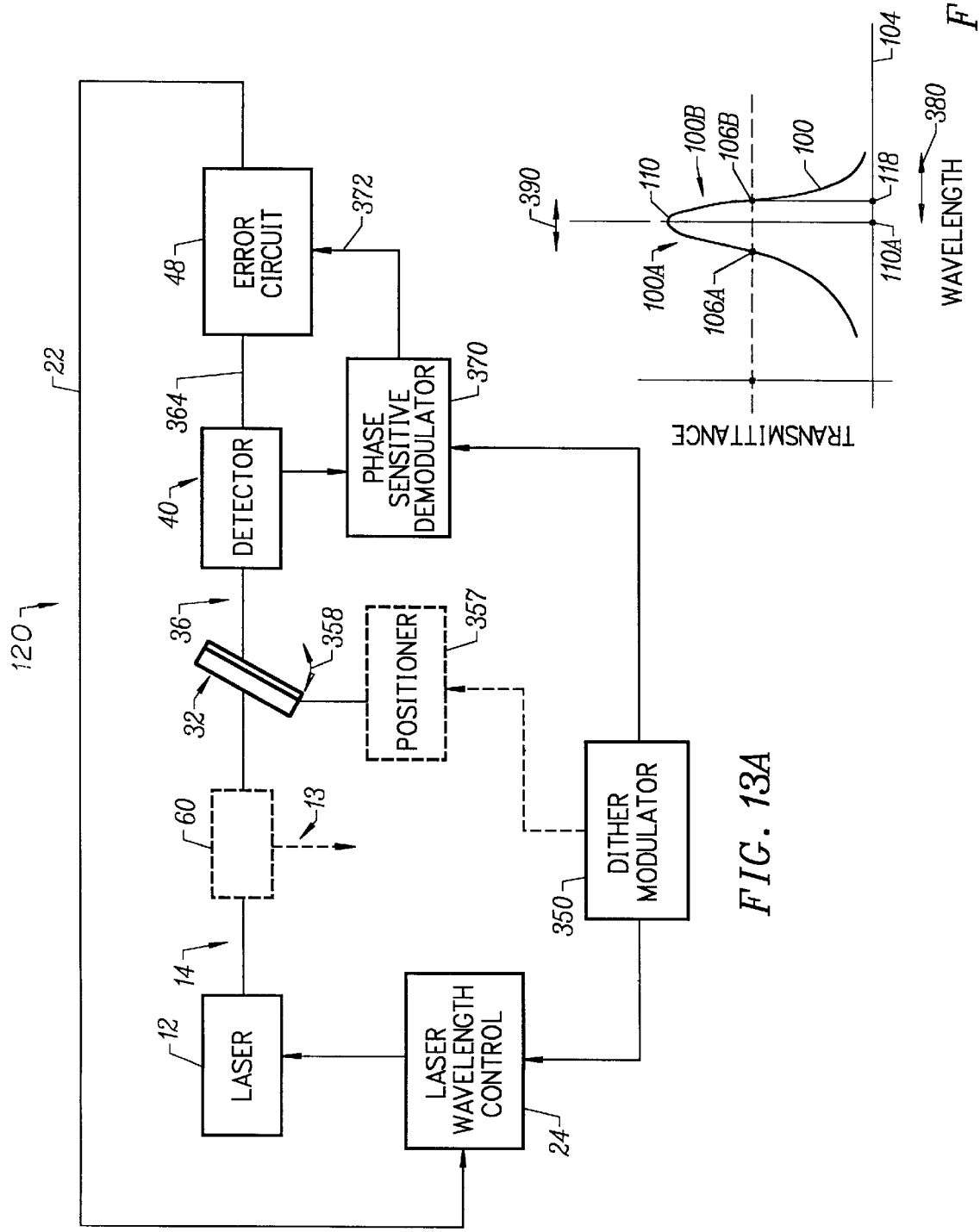
FIG. 13 illustrates another embodiment of the laser system and laser wavelength monitoring apparatus of FIG. 1.

FIGS. 13A and 13B illustrate the use of one optical filter, such as the first optical filter 32, and one detector, such as the first detector 40, in a laser system 120 including the monitoring and control of the wavelength of the laser 12. FIG. 13B, shows the SFF 100 for the first optical filter 32, which may or may not be angle tuned. A set-point wavelength 118 can correspond to the point 106B of the SFF 100. However, because the SFF 100 is equal at the points 106A and 106B, it is important to ensure that the first filtered beam 32 does indeed have a wavelength corresponding to negative slope 100B of the SFF 100 rather than the positive 110A. The slopes 110A and 100B, or portions thereof, can define, respectively, second and first tuning ranges. A dither modulator 350 can communicate with the laser wavelength control 24 or with the positioner 357, which can be a piezoelectric transducer or a stepper motor to impart a dither 380 in the wavelength or a dither 390 in the SFF. On the positive slope 106A, the intensity of the filtered beam 364 will change in phase with the dither; on the negative slope 106B it will change out of phase with the dither. Accordingly, a phase sensitive modulator 370 communicates with the dither modulator 350 to demodulate the detected signal for communicating with the error circuit 48, as indicated by reference numeral 372, to ensure operation on the positive slope 106B (i.e., in the proper tuning range) or to inform the error circuit of which slope to use in determining the error signal. The error circuit 48 includes an offset provision to account for the non zero detected signal 364 when the wavelength of the monitored beam is equal to the set-point wavelength 118.

Figure 14:
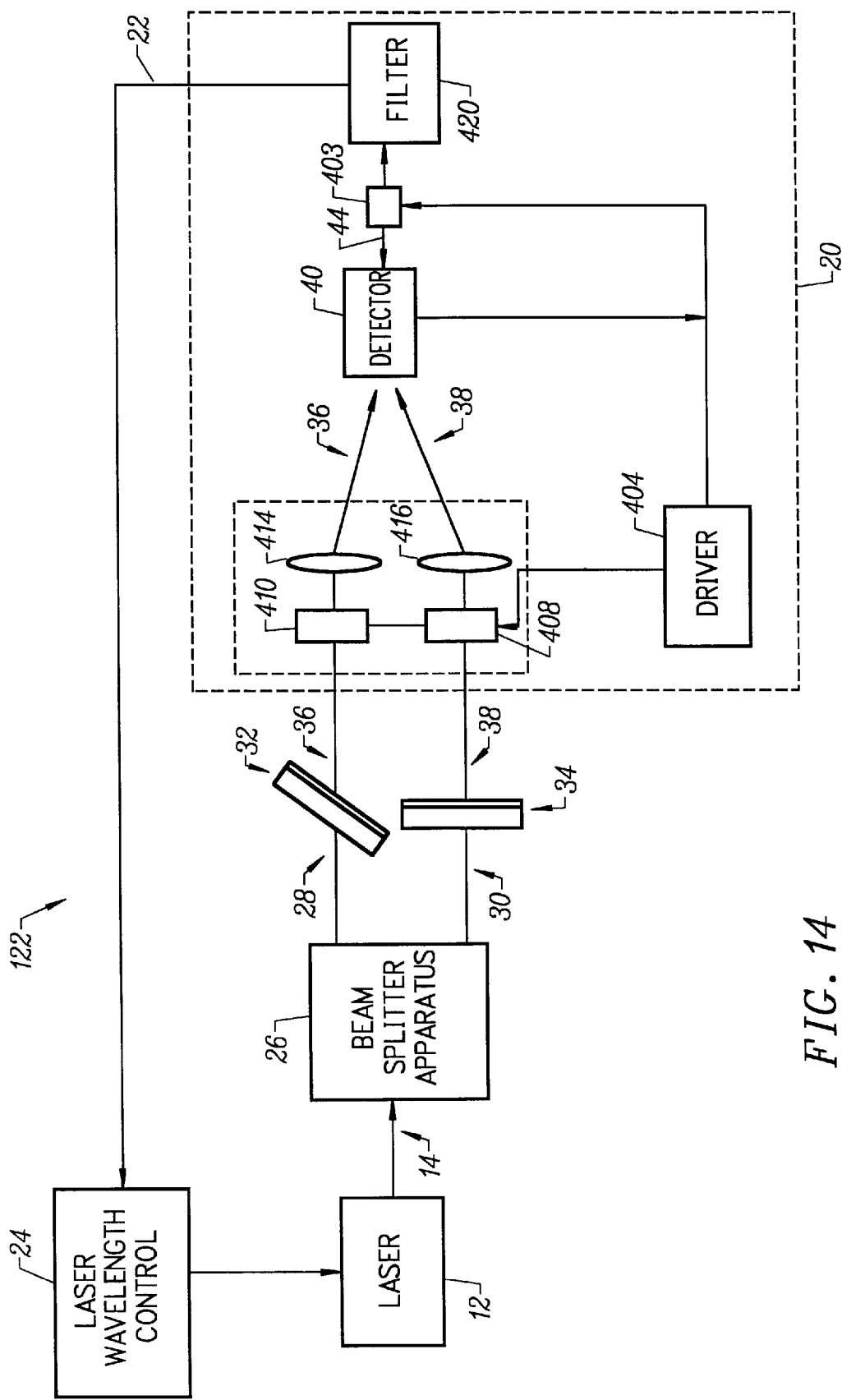
FIG. 14 illustrates a further embodiment of the laser system and laser wavelength monitoring apparatus of FIG. 1.

FIG. 14 illustrates a laser system 122 including provision for wavelength monitoring and control wherein the beam comparison element 20 time division multiplexes the first and second filtered beams onto a single detector. A switch driver 404 drives optical switches 408 and 410 for alternately switching the beams 36 and 38 to the detector 40. Optics elements 414 and 416 direct the first and second filtered beams, when passed by the switches 410 and 408, to the detector 40. The driver 404 communicates with a switch 403 for inverting the first detected signal communicated from the detector 403 to the filter 420 when the optical switch 410 directs the first filtered beam 36 to the detector 40. Accordingly, the filter 420 provides an output error signal for provision to the laser wavelength control 24, as indicated by reference numeral 22. As with the switch driver 162 of FIG. 5C, the duty cycle of the switch driver 404 can be varied for varying the set-point wavelength.

Figure 15:
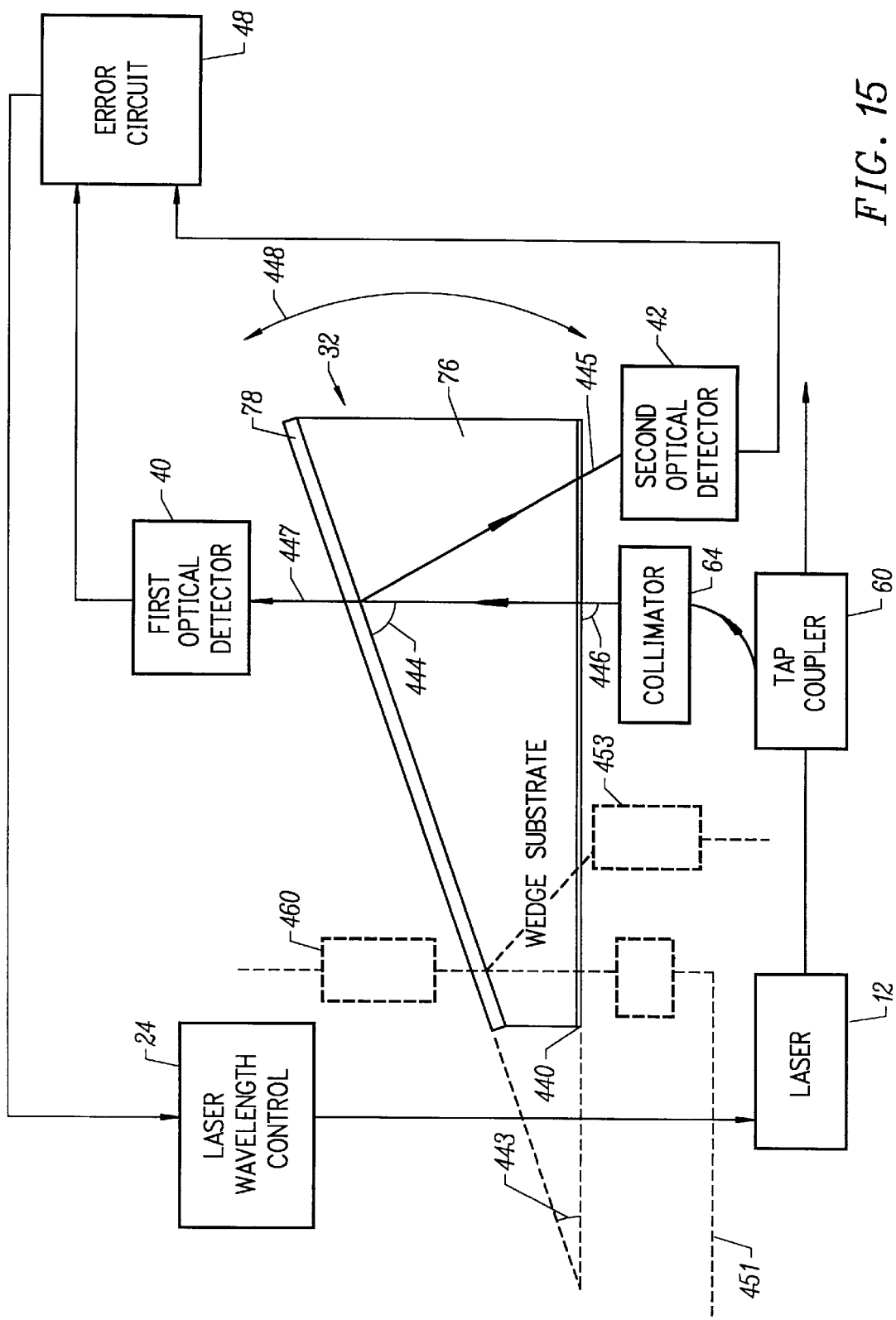
FIG. 15 illustrates yet another embodiment of the laser system and laser wavelength monitoring apparatus of FIG. 1.

FIG. 15 illustrates yet another embodiment of the laser system and laser wavelength monitoring apparatus of FIG. 1.

The tap coupler 60 taps a portion the laser radiation emanated by the laser 12. The collimator 64 collimates the radiation, which is incident on a first surface of the optical filter 32 at the angle 446 and on the filter layer 78 at an angle of incidence 444, which is related to the angle 446 by the wedge angle 443. As illustrated, the angle 446 can be ninety degrees. The substrate 76 is wedge shaped to reduce etalon effects and in addition to the filter layer 78 can include a nonreflective coating 440. The optical filter 32 transmits a first filtered beam 447 in accordance with a first spectral filter function and reflects a second filtered beam 445 in accordance with a second spectral filter function.

The first optical detector 40 receives the first filtered beam 447 for producing a first detected signal; the second optical detector receives the second optical beam 445 for producing a second detected signal. The error circuit 48, responsive to the first and second detected signals, produces an error signal, which can be provided to the laser wavelength controller 24, for controlling, monitoring or stabilizing the wavelength of the radiation emanating from the laser 12.

Figure 16:
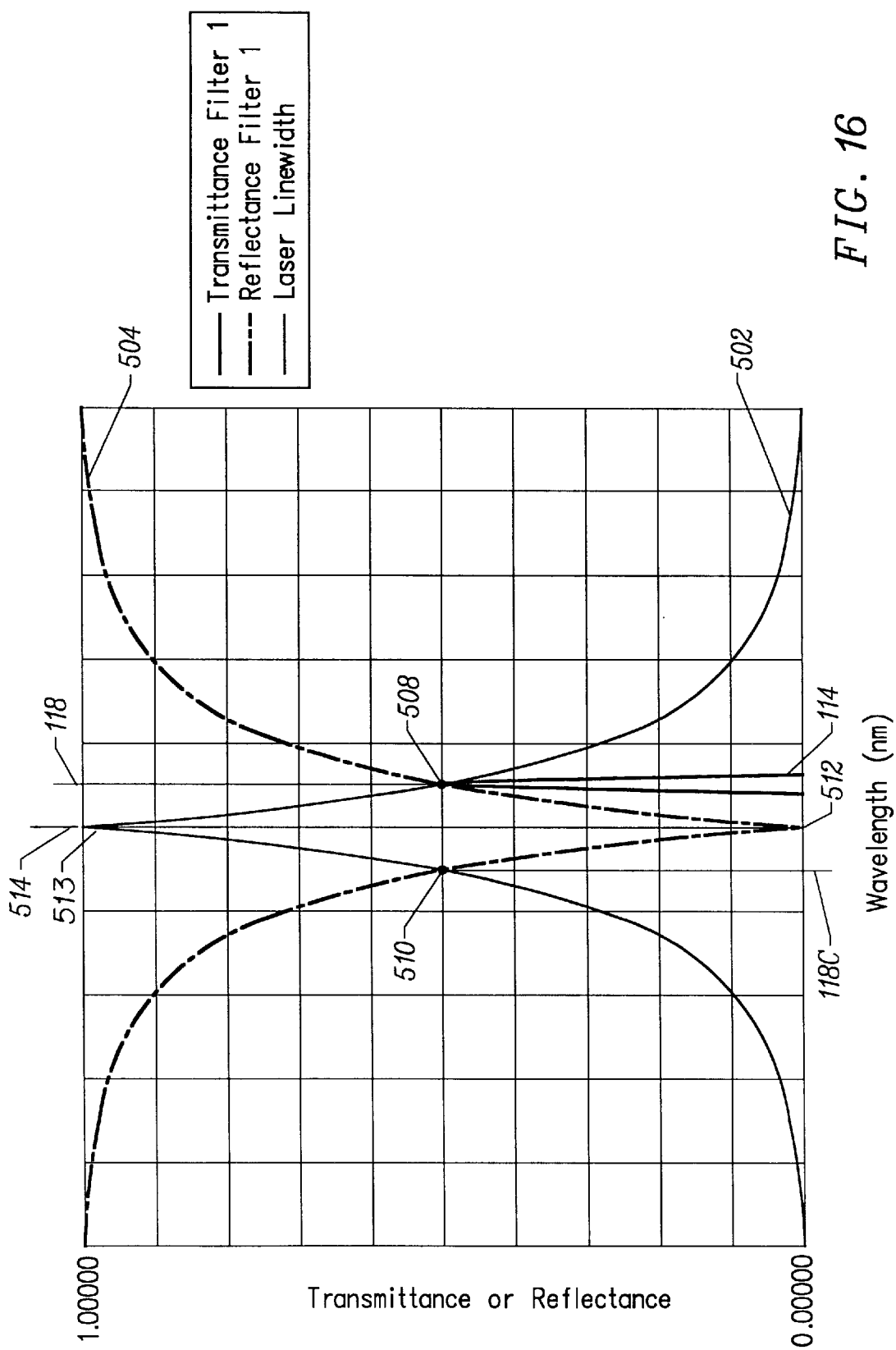
FIG. 16 illustrates first and second spectral filter functions corresponding to reflected and transmitted beams, respectively, produced by the optical filter of FIG. 15.

FIG. 16 illustrates the first and second spectral filter functions 502 (solid line) and 504 (broken line) corresponding to first and second filtered beams, 447 and 445, respectively. The first and second spectral filter functions 502 and 504 are inversely related, the first spectral filter function having a resonant response 513 corresponding to a peak and the second spectral filter function having a resonant response 512 corresponding to a null. As understood by one of ordinary skill in the art, the wavelength at which the resonant responses 513 and 512 occur are equal, or typically very nearly equal, and for convenience are both represented in FIG. 16 by reference numeral 514. The first and second spectral filter function cross at points 508 and 510, corresponding to first and second crossing wavelengths 118 and 118C. As understood by one of ordinary skill in the art, in light of the disclosure herein, the substrate 32 in FIG. 15 need not have a wedge shape. Furthermore, positioning the substrate 32 as described above or varying the wedge angle 443 shifts both the first and second spectral filter functions along the horizontal wavelength axis in FIG. 16, varying the crossing point wavelengths 118 and 118C (as well as the peak and null wavelengths). The line width 114 represent the laser radiation from laser 12.

Figure 17:
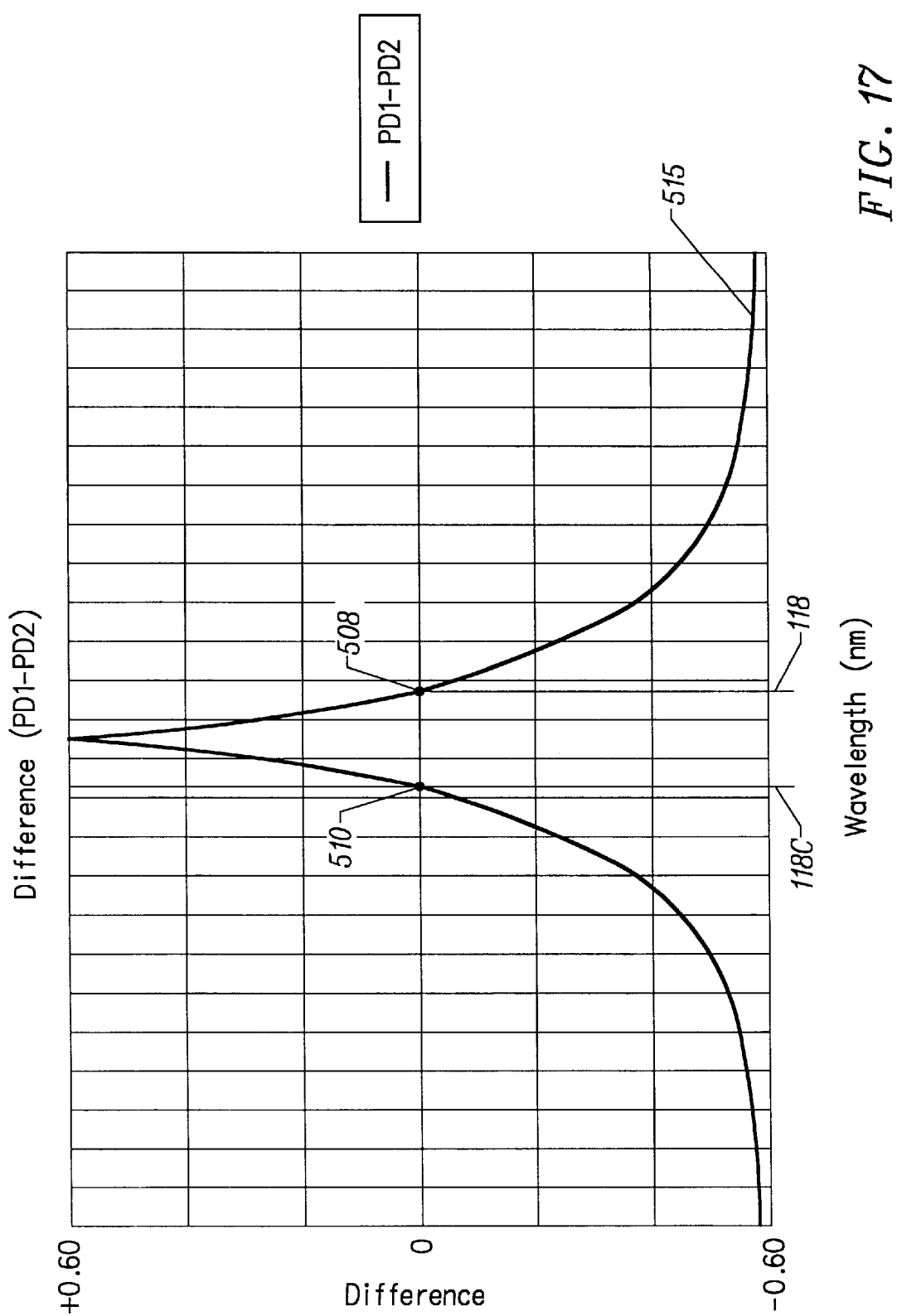
FIG. 17 illustrates the error signal as derived from the difference between the intensities of the reflected and transmitted beams of FIG. 16.

FIG. 17 illustrates the error signal obtained from the difference between the intensities of the reflected and transmitted beams of FIG. 16, typically derived by differencing the first and second detected signals. As discussed above, the error signal can also be derived by taking a ratio involving the first and second detected signals. Reference numerals 508 and 510 correspond to the crossing point wavelengths 118 and 118C respectively.

With reference again to FIG. 15, the substrate 32 can be used to monitor or control a second beam of laser radiation, spatially separated from the beam radiated by the laser 12, and having a wavelength differing therefrom. One of the crossing point wavelengths, such as 118C is used for control and/or monitoring the wavelength of the second beam, while the other is used in conjunction with the beam of radiation emanating from the laser 12. The second beam can proceed along the beam path 451. Optional third and fourth optical detectors 460 and 453 produce third and fourth detected signals for provision to an additional error circuit (not shown). Thus one optical filter 32 can be used to control or monitor the wavelength of two beams of radiation. The wavelength set points can be individually biased from the crossing wavelengths, using techniques described above.

It will thus be seen that the invention efficiently attains the objects set forth above, among those made apparent from the preceding description. Because certain changes may be made in the above constructions without departing from the scope of the invention, it is intended that all matter presented in the above description or shown in the accompanying drawings be interpreted as illustrative and not as limiting.

It is also understood that the following claims are to cover all generic and specific features of the invention described herein, and all statements of the scope of the invention which as a matter of language, might be said to fall therebetween.

Having described the invention, what is claimed as new and secured by Letters Patent is:

1. An apparatus for monitoring the wavelength of laser radiation, comprising:
    an optical beam splitting apparatus for splitting first and second split beams from a monitored beam having a monitored wavelength;
    a first optical filter responsive to said first split beam for producing therefrom a first filtered beam in accordance with a first spectral filter function;
    a second optical filter for producing, responsive to said second split beam, a second filtered beam in accordance with a second spectral filter function, said first and second spectral filter functions crossing at a crossing point wavelength;
    said first filter including a substrate having a filter layer thereon, said filter layer including at least one film layer having a dielectric constant differing from that of said substrate,
    a surface of one of said substrate and said filter layer disposed for receiving said first split beam at a nonzero angle of incidence, and
    a beam comparing element for comparing the intensities of said first and second filtered beams for producing an error signal responsive to the deviation of the wavelength of said monitored beam from a set point wavelength.

2. The apparatus of claim 1 further including a support element for mounting said first optical filter and a support frame for mounting said support element relative to said beamsplitter, and wherein said support element is laser welded to said frame.

3. The apparatus of claim 1 wherein said nonzero angle of incidence is selected to select said crossing point wavelength.

4. The apparatus of 1 wherein said first and second filters are substantially physically identical.

5. The apparatus of claim 1 wherein said beam comparison element includes first and second optical detectors for detecting said first and second filtered beams, respectively, and for producing, respectively, first and second detected signals, and an error circuit responsive to said first and second signals for producing said error signal.

6. The apparatus of claim 5 wherein said error circuit includes
    a summing circuit for summing the first and second signals to produce a summed signal,
    a first circuit means for determining a first ratio of a first reference voltage to said summed signal, and
    a second circuit means responsive to said first circuit means for multiplying said second signal by a factor substantially equal to said first ratio to produce an error signal representative of a ratio of said second signal divided by the sum of said first and second signals.

7. The error circuit of claim 6 wherein said first circuit means includes
    a first digital to analog converter for applying a gain to said summed signal to produce an intermediate signal representative of the said product of said summed signal and said gain;
    a digital controller for controlling said first digital to analog controller to control said gain;
    a comparator responsive to said intermediate signal and said reference voltage for providing a feedback signal to said controller for controlling said gain; and wherein said second circuit means includes a second digital to analog converter, responsive to controller, for said multiplying of said second signal.

8. The apparatus of claim 5 wherein said error circuit includes an electronic switch and a driver for driving an output of said switch between electrical communication with said first and second detectors respectively, such that said output is representative of said first and second detected signals respectively, and a filter for filtering said output signal.

9. The apparatus of claim 8 wherein said error circuitry is adapted for varying the duty cycle of said switch for varying said set point wavelength.

10. The apparatus of claim 5 wherein said error circuitry includes a first operational amplifier having an input responsive to said first detected signal and a second operational amplifier having an input responsive to the inverse of said second detected signal, and a resistive combining circuit for combining the outputs of said operational amplifiers.

11. The apparatus of claim 10 wherein said resistive combining circuit includes a variable resistance element for varying the set point wavelength of said error circuit.

12. The apparatus of claim 5 wherein said error circuitry includes a first operational amplifier having an input responsive to said first detected signal and a second operational amplifier having an input responsive to the inverse of said second detected signal, and a combining including a digital potentiometer for combining the output of said operational amplifiers.

13. The apparatus of claim 1 including a collimator for receiving the monitored beam from a fiber and for collimating the monitored beam to travel an optical path in free space for receipt thereof by said beam splitter.

14. The apparatus of claim 1 wherein said beam splitter includes at least one optical waveguide coupler.

15. The apparatus of claim 1 wherein said beam splitter apparatus is adapted for transmitting at least a portion of said monitored beam as an output beam along a free-space output optical beam path substantially collinear with an input optical beam path traversed by said monitored beam as it is received by said beam splitting apparatus.

16. The apparatus of claim 13 including an input collimator for receiving the monitored beam from a first optical fiber and for collimating the monitored beam to travel the input optical path in free space for receipt thereof by said beam splitter, and an output collimator coupled to an output for receiving the output monitored beam traveling in free space for transmission by the output fiber.

17. The apparatus of claim 5 wherein at least one of said detectors is a PIN photodetector capable of operation in a photovoltaic mode.

18. The apparatus of claim 1 wherein said beam comparison element includes first and second optical switches for receiving, respectively, said first and second filtered beams;
  a detector for receiving said first and second filtered beams from said first and second optical switches, to produce a detected signal
  a filter in electrical communication with said detector for filtering said detected signal to produce said error signal; and
  a driver circuit for driving said first and second optical switches for time-division multiplexing said first and second filtered beams.

19. A wavelength-stabilized laser system, comprising:
  a laser for producing a beam of laser radiation having a selected wavelength;
  means for splitting first and second laser light beams from said beam of laser radiation;
  a first optical filter disposed for receiving at least a portion of said first split beam, said first filter producing a first filtered beam;
  a photodetector for receiving at least a portion of said first filtered beam and for producing a first detector signal;
  a second optical filter disposed for receiving at least a portion of said second split beam and for producing a second filtered beam;
  a second photodetector for receiving at least a portion of said second split beam and for producing a second detected signal;
  said first filter including a substrate having a filter layer, said filter layer including at least one film layer having a dielectric constant differing from that of said substrate,
  an error signal circuit in electrical communication with said first and second photodetectors for generating an error signal responsive to said first and second detected signals and responsive to the deviation of the wavelength of the laser radiation from a set point wavelength;
  a laser wavelength control element in electrical communication with said error circuit for adjusting the operating temperature of said laser in response to said error signal so as to tend toward said set point wavelength; and wherein
  said first split beam is incident on a surface of one of said substrate and said filter layer at a selected nonzero angle of incidence, said angle selected such that said first and second spectral filter functions define at least one of a wavelength capture range and a wavelength tuning range, said selected range including said set point wavelength.

20. Apparatus for monitoring the wavelength of a monitored beam of laser radiation, comprising
  at least one optical filter, said optical filter including a substrate having a filter layer, said filter layer including at least one film layer having a dielectric constant differing from that of said substrate, said optical filter for receiving at least a portion of said monitored beam at a selected nonzero angle of incidence to a surface of one of said substrate and said filter layer and for producing a first filtered beam in accordance with a first spectral filtering function having a resonant response at a resonant response wavelength;
  at least one detector for detecting said first filtered beam to produce a first detected signal representative of the intensity of said first filtered beam;
  an error circuit in electrical communication with said detector and for producing responsive to said detected signal an error signal responsive to the deviation of the wavelength of said monitored beam from a set point wavelength; and wherein
  said selected nonzero angle of incidence is selected such that said spectral filter function defines a capture range of wavelengths that includes said set point wavelength.

21. The apparatus of claim 20 wherein said apparatus includes a dithering means for introducing a dither to said wavelength of said monitored beam and wherein said detector is responsive to said dither means for phase sensitive detection of said filtered beam for determining whether said monitored wavelength is within said first selected tuning range.

22. The apparatus of claim 20 including
  first means for varying said selected angle of incidence, said means including at least one of a piezoelectric transducer and a motor;
  a dithering circuit for controlling said first means for introducing a dither in said selected angle of incidence; and wherein
  said detector is responsive to said dithering circuit for phase sensitive detection of said filtered beam.

23. Apparatus for monitoring the wavelength of laser radiation, comprising
  a beam splitting apparatus disposed for splitting first and second split beams from a monitored beam;
  a first optical filter for receiving said first split beam and for producing therefrom a first filtered beam in accordance with a first spectral filtering function;
  a second optical filter for receiving said second split beam and for producing therefrom a second filtered beam in accordance a second spectral filtering function differing from said first spectral filtering function;
  first and second photodetectors for receiving at least a portion of said first and second filtered beams respectively, and for producing therefrom, respectively, first and second detected signals;
  an error circuit for producing, responsive to said first and second detected signals, an output signal representative of the deviation of said monitored wavelength from a set point wavelength, said error circuit including a summing circuit for summing the first and second detected signals to produce a summed signal, a first circuit means for determining a first ratio of a first reference voltage to said summed signal, and a second circuit means responsive to said first circuit means for multiplying said second signal by a factor substantially equal to said first ratio to produce an output signal representative of a ratio of said second signal divided by the sum of said first and second signals.

24. The apparatus of claim 23 further including a combining circuit for combining said output signal with a second reference voltage to produce an offset output signal.

25. The error circuit of claim 23 wherein said first circuit means includes a variable gain amplifier for applying a gain to said summed signal such that the product of said summed signal and said gain is substantially equal to said first reference voltage, whereby said gain represents said ratio of said summed signal to said reference voltage.

26. The error circuit of claim 25 wherein said second circuit means includes a second variable gain amplifier for multiplying said second signal.

27. The error circuit of claim 26 wherein said variable gain amplifier includes a digital to analog converter, and wherein said first circuit means further includes a digital controller for controlling said digital to analog controller to control said gain.

28. The error circuit of claim 27 wherein said digital to analog converter produces an intermediate signal representative of the said product of said summed signal and said gain, and wherein said first circuit means includes a comparator responsive to said intermediate signal and said reference voltage for providing a feedback signal to said controller for controlling said gain.

29. The error circuit of claim 27 wherein said second circuit means includes a second digital to analog controller, and wherein said controller controls said second digital-to-analog controller for multiplying said second signal by said factor.

30. The error circuit of claim 25 wherein said combining circuit includes a resistive circuit for summing said output signal with said second reference voltage, said second reference voltage being negative.

31. The error circuit of claim 25 wherein said combining circuit includes a circuit for taking the difference between said output signal and said second reference voltage.

32. An error circuit for producing a signal responsive to a ratio of first and second signals, the first and second signals representative of the intensity of first and second optical beams, respectively, comprising a summing circuit for summing the first and second signals to produce a summed signal, a first circuit means for determining a first ratio of a first reference voltage to said summed signal, and a second circuit means responsive to said first circuit means for multiplying said second signal by a factor substantially equal to said first ratio to produce an output signal representative of a ratio of said second signal divided by the sum of said first and second signals.

33. An apparatus for monitoring the wavelength of laser radiation, comprising an optical filter for receiving a beam of laser radiation and for transmitting a first filtered beam in accordance with a first spectral filter function and for reflecting a second filtered beam in accordance with a second spectral filter function inversely related to said first spectral filter function, said spectral filter functions crossing at least one crossing wavelength;

said optical filter including a substrate having a filter layer on a first surface thereof, said filter layer including at least one film layer having a dielectric constant differing from that of said substrate, a beam comparing element for comparing the intensities of said first and second filtered beams for producing a signal responsive to the deviation of the wavelength of said beam from a set point wavelength.

34. An apparatus for monitoring the wavelength of laser radiation, comprising an optical filter for receiving spatially separated first and second beams of laser radiation and for, responsive to said first beam, transmitting a first filtered beam in accordance with a first spectral filter function and reflecting a second filtered beam in accordance with a second spectral filter function inversely related to said first spectral filter function, said first and second filter functions crossing at first and second crossing wavelengths, said optical filter further responsive to said second beam for transmitting a third filtered beam in accordance with said first spectral filter function and reflecting a fourth filtered beam in accordance with said second spectral filter function;

said optical filter including a substrate having a filter layer on a first surface thereof, said filter layer including at least one film layer having a dielectric constant differing from that of said substrate, first and second optical detectors for receiving said first and second filtered beams, respectively, and for producing first and second detected signals;

third and fourth optical detectors for receiving said third and fourth filtered beams, respectively, and for producing third and fourth detected signals;

a first error circuit for producing, responsive to said first and second detected signals, a first error signal responsive to the deviation of the wavelength of said first beam of radiation from one of the first crossing wavelength and a set point wavelength biased therefrom; and a second error circuit for producing, responsive to said third and fourth detected signals a second error signal responsive to the deviation of the wavelength of said second beam from said second crossing wavelength and a set point biased therefrom.

35. The apparatus of claim 34 wherein said substrate includes a second surface disposed at an angle to said first surface for receiving said beam for reflection and transmission of said beam by said first surface to produce said first and second filtered beams, respectively.

36. The apparatus of claim 35 wherein said substrate has a wedge shape and said optical filter includes an anti-reflective coating on said second surface.

37. The apparatus of claim 34 wherein said beam comparison element includes first and second optical detectors for detecting said first and second filtered beams, respectively, and for producing first and second detected signals, and an error circuit for producing, responsive to said first and second signals an error signal representative of one of a ratio involving said first and second signals and a subtraction of said first and second signals.

38. The apparatus of claim 37 wherein said beam comparison element includes first and second optical detectors for detecting said first and second filtered beams, respectively, and for producing first and second detected signals; and an error circuit responsive to said first and second detected signals for producing a signal responsive to the difference between the wavelength of said beam and one of said first and second zero bias set point wavelengths.

39. The apparatus of claim 38 further including third and fourth optical detectors for receiving, respectively, third and fourth filtered beams transmitted and reflected, respectively, by said optical filter from a second beam of laser radiation incident on said filter and spatially separated from said first beam; and a second error circuit for producing a signal responsive to the difference between the wavelength of said second beam and the other of said first and second zero bias set points.

40. A method of calibrating a laser wavelength monitoring apparatus, the method comprising the steps of operating a laser at a first wavelength provide a laser beam having the first wavelength;

filtering at least a first portion of the laser beam with a first optical filter to produce a filtered beam in accordance with a first spectral filter function having a resonant response at resonance response wavelength;

measuring the intensity of said first filtered beam;

filtering at least a second portion of the laser beam with a second optical filter to produce a second filtered beam, the second optical filter including a substrate having a filter layer thereon, said filter layer including at least one film layer having an index of refracting different from that of the substrate, said step of filtering including directing the beam of radiation a surface of one of said substrate and said filter layer;

monitoring the measured intensity of said second filtered beam;

selecting final angle of incidence, the step of selecting including adjusting the angle of incidence of the laser beam to said surface to vary the spectral filter function of the second filter such that the intensity of said second filtered beam is substantially equal to the intensity of said first filtered beam;

said final angle further selected such that said first and said second spectral filter functions define tuning range of wavelengths within which a signal uniquely representative of a deviation of the wavelength of the laser from said first wavelength can be produced by comparing the intensities of said first and second filtered beams.

* * * * *